(12) United States Patent
Chang et al.

(10) Patent No.: US 11,040,870 B2
(45) Date of Patent: Jun. 22, 2021

(54) MICROELECTROMECHANICAL SYSTEMS DEVICE HAVING A MECHANICALLY ROBUST ANTI-STICTION/OUTGASSING STRUCTURE

(71) Applicant: Taiwan Semiconductor Manufacturing Co., Ltd., Hsin-Chu (TW)

(72) Inventors: Kuei-Sung Chang, Kaohsiung (TW); Chun-Wen Cheng, Zhubei (TW); Fei-Lung Lai, New Taipei (TW); Shing-Chyang Pan, Jhudong Township (TW); Yuan-Chih Hsieh, Hsinchu (TW); Yi-Ren Wang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/521,907

(22) Filed: Jul. 25, 2019

(65) Prior Publication Data

US 2021/0024348 A1    Jan. 28, 2021

(51) Int. Cl.
  *B81B 3/00* (2006.01)
  *B81C 1/00* (2006.01)

(52) U.S. Cl.
  CPC ........ *B81B 3/0013* (2013.01); *B81C 1/00984* (2013.01); *B81B 2203/04* (2013.01); *B81B 2207/07* (2013.01)

(58) Field of Classification Search
  CPC .... B81B 7/0035–0041; B81C 1/00277–00293
  See application file for complete search history.

(56) References Cited

U.S. PATENT DOCUMENTS

| | | | |
|---|---|---|---|
| 2006/0166403 A1* | 7/2006 | Ouellet | B81C 1/00666 438/109 |
| 2012/0248608 A1* | 10/2012 | Yoo | H01L 23/485 257/751 |
| 2016/0167945 A1* | 6/2016 | Chang | B81B 3/001 257/415 |
| 2016/0185592 A1* | 6/2016 | Hsieh | C23C 16/50 257/415 |
| 2016/0332863 A1* | 11/2016 | Cheng | H01L 24/00 |

(Continued)

OTHER PUBLICATIONS

Wikipedia.org "Yield (engineering)." Published on Jun. 27, 2019.

*Primary Examiner* — Moazzam Hossain
*Assistant Examiner* — Mohammad A Rahman
(74) *Attorney, Agent, or Firm* — Eschweiler & Potashnik, LLC

(57) ABSTRACT

Various embodiments of the present disclosure are directed towards a microelectromechanical system (MEMS) device. The MEMS device includes a dielectric structure disposed over a first semiconductor substrate, where the dielectric structure at least partially defines a cavity. A second semiconductor substrate is disposed over the dielectric structure. The second semiconductor substrate includes a movable mass, where opposite sidewalls of the movable mass are disposed between opposite sidewall of the cavity. An anti-stiction structure is disposed between the movable mass and the dielectric structure, where the anti-stiction structure is a first silicon-based semiconductor.

20 Claims, 16 Drawing Sheets

(56) References Cited

U.S. PATENT DOCUMENTS

| | | | |
|---|---|---|---|
| 2017/0203962 A1* | 7/2017 | Cheng | B81C 1/00285 |
| 2017/0210612 A1* | 7/2017 | Chen | B81B 3/001 |
| 2017/0313574 A1* | 11/2017 | Hsieh | B81B 3/0005 |
| 2019/0062153 A1 | 2/2019 | Tseng et al. | |
| 2019/0092627 A1* | 3/2019 | Lin | B81B 7/008 |
| 2019/0119099 A1* | 4/2019 | Chen | B81B 3/001 |
| 2019/0382261 A1* | 12/2019 | Lee | B81B 3/0016 |

* cited by examiner

MICROELECTROMECHANICAL SYSTEMS DEVICE HAVING A MECHANICALLY ROBUST ANTI-STICTION/OUTGASSING STRUCTURE

BACKGROUND

Microelectromechanical systems (MEMS) devices are microscopic devices that integrate mechanical and electrical components to sense physical quantities and/or to act upon surrounding environments. In recent years, MEMS devices have become increasingly common. For example, the use of MEMS devices as sensing devices (e.g., motion sensing devices, pressure sensing devices, acceleration sensing devices, etc.) has become widespread in many of today's personal electronics (e.g., smart phones, fitness electronics, personal computing devices). MEMS devices are also used in other applications, such as vehicle applications (e.g., for accident detection and airbag deployment systems), aerospace applications (e.g., for guidance systems), medical applications (e.g., for patient monitoring), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
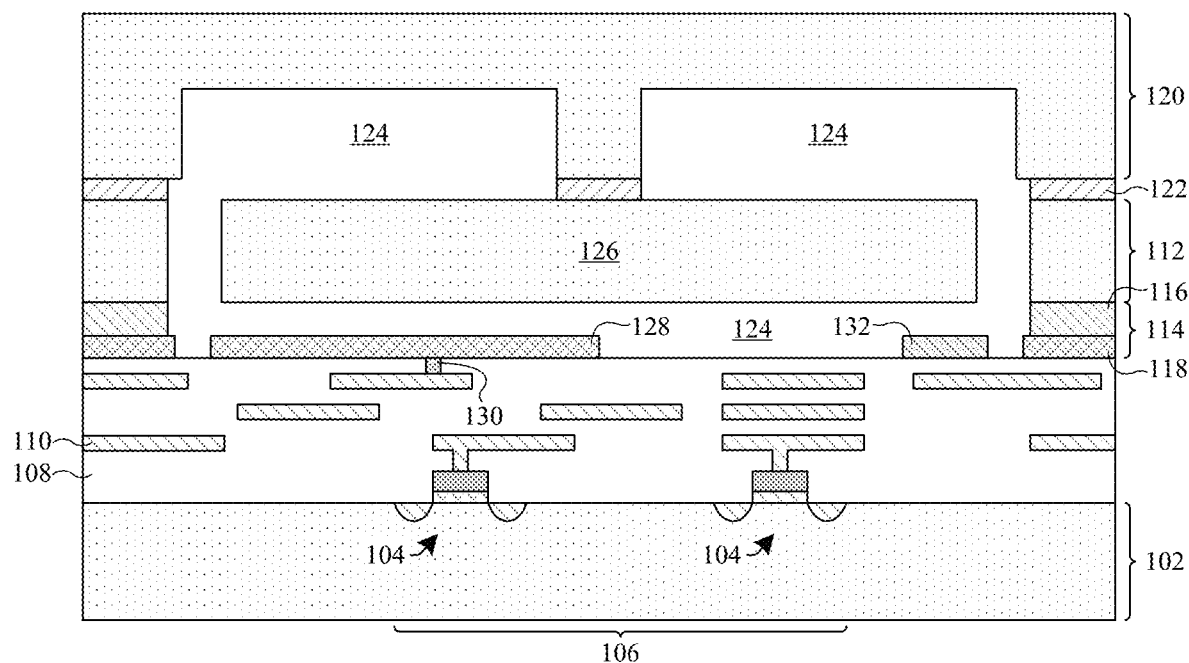
FIG. 1 illustrates a cross-sectional view of some embodiments of a microelectromechanical systems (MEMS) device having a mechanically robust anti-stiction structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many MEMS devices (e.g., accelerometers, gyroscopes, etc.) comprise a movable mass and a fixed electrode plate. The movable mass has a planar surface aligned in parallel and spaced apart from an opposed planar surface of the fixed electrode plate. In response to external stimuli (e.g., pressure, acceleration, gravity, etc.), the movable mass is displaced inside a cavity. This displacement changes a distance between the movable mass and the fixed electrode plate. The change in distance may be detected by a change in capacitive coupling between the movable mass and the fixed electrode and analyzed by appropriate electrical circuits to derive a measurement of a physical quantity associated with the change in distance, such as acceleration.

One of the design challenges with a MEMS device is to prevent the movable mass from sticking to adjacent parts of the MEMS device, an effect known as stiction. One instances in which stiction occurs is during normal operation of the MEMS device when the movable mass suddenly becomes "stuck" to a neighboring surface. The movable mass may become "stuck" to the neighboring surface due to any one of several different effects, such as capillary force, molecular van der Waals force, or electrostatic forces between neighboring surfaces. The extent to which these effects cause such stiction can vary based on many different factors, such as temperature of the surfaces, contact area between the surfaces, contact potential difference between the surfaces, whether the surfaces are hydrophilic or hydrophobic, and so on.

One partial solution to limit such stiction is to utilize a bumper structure disposed in the cavity. The bumper structure may limit such stiction for any one of several, such as effectively reducing the overall contact area between the movable mass and neighboring surfaces. The bumper structure is typically made of a material (e.g., aluminum-copper (AlCu)) that has a relatively low yield stress (e.g., less than or equal to about 1,000 megapascal (MPa)). However, because the bumper structure is typically made of a material that has a relatively low yield stress, relatively large impact forces from the movable mass may deform the bumper structure (e.g., plastic deformation). The resulting deformation of the bumper structure may reduce the effectiveness of the bumper structure in limiting future stiction (e.g., due to the deformation increasing the overall contact area between the movable mass and the deformed bumper structure).

Various embodiments of the present application are directed toward a MEMS device having a mechanically robust anti-stiction structure. The MEMS device includes an interlayer dielectric (ILD) structure that is disposed over a first semiconductor substrate. An upper surface of the ILD structure at least partially defines a bottom of a cavity. A second semiconductor substrate is disposed over the ILD structure and comprises a movable mass. In response to external stimuli, the movable mass is configured to be displaced within the cavity. The anti-stiction structure is disposed between the moveable mass and the upper surface of the ILD structure. The anti-stiction structure is a silicon-based semiconductor (e.g., polycrystalline silicon, monocrystalline silicon, amorphous silicon, etc.). Because the anti-stiction structure is a silicon-based semiconductor, the anti-stiction structure has a relatively high yield stress. Because the anti-stiction structure has a relatively high yield stress (e.g., between about 5,000 MPa and about 9,000 MPa), relatively large impact forces from the movable mass may not deform the anti-stiction structure (e.g., may not cause plastic deformation of the anti-stiction structure). Accordingly, the anti-stiction structure may improve the mechanical robustness of the MEMS device, thereby expanding real-world applications (e.g., high-impact resistant MEMS devices) and/or improving device performance (e.g., improving sensing performance over the lifetime of the MEMS device).

FIG. 1 illustrates a cross-sectional view of some embodiments of a microelectromechanical systems (MEMS) device 100 having a mechanically robust anti-stiction structure 132.

As shown in FIG. 1, the MEMS device 100 comprises a first semiconductor substrate 102. The first semiconductor substrate 102 may comprise any type of semiconductor body (e.g., monocrystalline silicon/CMOS bulk, silicon-germanium (SiGe), silicon on insulator (SOI), etc.). One or more semiconductor devices 104 may be disposed on/in the first semiconductor substrate 102. The one or more semiconductor devices 104 may be or comprise, for example, metal-oxide-semiconductor (MOS) field-effect transistors (FETs), some other MOS devices, or some other semiconductor devices. In some embodiments, the one or more semiconductor devices 104 may be part of a sensing circuit 106. In further embodiments, the first semiconductor substrate 102 may be referred to as a complementary metal-oxide-semiconductor (CMOS) substrate.

An interlayer dielectric (ILD) structure 108 is disposed over the first semiconductor substrate 102 and the one or more semiconductor devices 104. An interconnect structure 110 (e.g., copper interconnect) is embedded in the ILD structure 108. The interconnect structure 110 comprises a plurality of conductive features (e.g., metal lines, metal vias, metal contacts, etc.). In some embodiments, the ILD structure 108 comprises one or more stacked ILD layers, which may respectively comprise a low-k dielectric (e.g., a dielectric material with a dielectric constant less than about 3.9), an oxide (e.g., silicon dioxide ($SiO_2$)), or the like. In further embodiments, the plurality of conductive features may comprise, for example, copper (Cu), aluminum (Al), tungsten (W), titanium (Ti), titanium nitride (TiN), aluminum-copper (AlCu), some other conductive material, or a combination of the foregoing. In yet further embodiments, the ILD structure 108 may be referred to as a dielectric structure.

A second semiconductor substrate 112 is disposed over both the ILD structure 108 and the first semiconductor substrate 102. The second semiconductor substrate 112 may comprise any type of semiconductor body (e.g., monocrystalline silicon/CMOS bulk, SiGe, SOI, etc.). In some embodiments, the second semiconductor substrate 112 may have a first doping type (e.g., p-type/n-type). In further embodiments, the second semiconductor substrate 112 may be referred to as a MEMS substrate.

In some embodiments, the second semiconductor substrate 112 is bonded to the first semiconductor substrate 102 via a first bond structure 114 (e.g., a eutectic bond structure). The first bond structure 114 may comprise an upper bond ring 116 disposed on a lower bond ring 118. In some embodiments, the first bond structure 114 is electrically conductive. The lower bond ring 118 may comprise, for example, AlCu, Cu, Al, Ti, gold (Au), tin (Sn), some other bonding material, or a combination of the foregoing. The upper bond ring 116 may comprise, for example, germanium (Ge), Cu, Al, Au, Sn, some other bonding material, or a combination of the foregoing.

In some embodiments, a third semiconductor substrate 120 is disposed over both the second semiconductor substrate 112 and the first semiconductor substrate 102. The third semiconductor substrate 120 may comprise any type of semiconductor body (e.g., monocrystalline silicon/CMOS bulk, SiGe, SOI, etc.). In further embodiments, the third semiconductor substrate 120 may be referred to as a cap substrate. In some embodiments, the third semiconductor substrate 120 is bonded to the second semiconductor substrate 112 via a second bond structure 122. The second bond structure 122 may comprise, for example, Ge, $SiO_2$, Cu, Al, Au, Sn, Ti, some other bonding material, or a combination of the foregoing.

The ILD structure 108 at least partially defines a cavity 124. In some embodiments, the ILD structure 108, the second semiconductor substrate 112, the first bond structure 114, the third semiconductor substrate 120, and the second bond structure 122 at least partially define the cavity 124. In further embodiments, the third semiconductor substrate 120 and the second bond structure 122 at least partially define an upper portion of the cavity 124, and the ILD structure 108 and the first bond structure 114 at least partially define a lower portion of the cavity 124.

The second semiconductor substrate 112 comprises a movable mass 126 (e.g., proof mass). The movable mass 126 is a portion of the second semiconductor substrate 112 that is suspended in the cavity 124 by one or more tethers. The movable mass 126 is configured to be displaced inside the cavity 124 in response to external stimuli (e.g., pressure, acceleration, gravity, etc.). In some embodiments, the movable mass 126 may be electrically coupled to the sensing circuit 106 (e.g., via the interconnect structure 110, the first bond structure 114, and a doped conductive path disposed in the second semiconductor substrate 112 (not shown)).

A first sensing electrode 128 is disposed within the cavity 124. The first sensing electrode 128 is electrically coupled to the interconnect structure 110 via one or more upper conductive vias of a plurality of upper conductive vias 130 (e.g., metal vias) of the interconnect structure 110. In some embodiments, the plurality of upper conductive vias 130 of the interconnect structure 110 may be a plurality of uppermost conductive vias of the interconnect structure 110. In further embodiments, the first sensing electrode 128 may be disposed within the ILD structure 108. In yet further embodiments, the first sensing electrode 128 may be a portion of an upper conductive line (e.g., upper metal line) of the interconnect structure 110.

In some embodiments, the interconnect structure 110 electrically couples the first sensing electrode 128 to the sensing circuit 106. In further embodiments, the sensing circuit 106 is configured to measure and analyze a change in capacitive coupling between the movable mass 126 and the first sensing electrode 128 to derive a measurement of a physical quantity (e.g., acceleration) associated with a change in distance between the movable mass 126 and the first sensing electrode 128. In some embodiments, the first sensing electrode may comprise, for example, TiN, Cu, Al, W, AlCu, some other conductive material, or a combination of the foregoing. In further embodiments, the first sensing electrode 128 may have a same chemical composition as the lower bond ring 118.

An anti-stiction structure 132 is disposed in the cavity 124. The anti-stiction structure 132 is disposed between the movable mass 126 and the ILD structure 108. In some embodiments, the anti-stiction structure 132 contacts the ILD structure 108. In further embodiments, the anti-stiction structure 132 is electrically conductive.

In some embodiments, the anti-stiction structure 132 comprises a semiconductor material (e.g., silicon (Si), Ge, etc.). The anti-stiction structure 132 may be an undoped semiconductor (e.g., intrinsic semiconductor) or a doped semiconductor (e.g., extrinsic semiconductor). In further embodiments, the anti-stiction structure 132 comprises a higher concentration of first doping type dopants (e.g., n-type dopants) than second doping type dopants (e.g., p-type dopants), or vice versa. In further embodiments, the anti-stiction structure 132 has an electrical resistivity less than or equal to about 100 ohm-centimeter ($\Omega \cdot cm$). In yet further embodiments, the electrical resistivity of the anti-stiction structure 132 is between about 0.5 milliohm-centimeter ($m\Omega \cdot cm$) and about 100 $\Omega \cdot cm$.

In some embodiments, the anti-stiction structure 132 comprises silicon. In such embodiments, the anti-stiction structure 132 may be referred to as a silicon-based anti-stiction structure. In further embodiments, the anti-stiction structure 132 may consist essentially of silicon. It will be appreciated that, in some embodiments, an anti-stiction structure 132 consisting essentially of silicon may comprise first doping type dopants and/or second doping type dopants. In further embodiments, the anti-stiction structure 132 may be a silicon-based semiconductor. The anti-stiction structure 132 may be an amorphous solid (e.g., amorphous silicon). In other embodiments, the anti-stiction structure 132 may be a crystalline solid (e.g., monocrystalline silicon, polycrystalline silicon, etc.). In further embodiments, the anti-stiction structure 132 may be a monocrystalline solid (e.g., monocrystalline silicon). In yet further embodiments, the anti-stiction structure 132 may be a polycrystalline solid (e.g., polycrystalline silicon).

In some embodiments, the anti-stiction structure 132 may have a yield stress greater than or equal to 1,000 MPa. More specifically, the anti-stiction structure 132 may have a yield stress greater than or equal to 5,000 MPa. More specifically, the anti-stiction structure 132 may have a yield stress between 5,000 MPa and 9,000 MPa. In some embodiments, the anti-stiction structure 132 has a different chemical composition than the first sensing electrode 128. For example, the anti-stiction structure 132 may be silicon-based (e.g., monocrystalline silicon, polycrystalline silicon, or amorphous silicon) and the first sensing electrode 128 may be metal-based (e.g., TiN, W, AlCu, etc.). In further embodiments, the yield stress of the anti-stiction structure 132 is greater than a yield stress of the first sensing electrode 128.

Because the anti-stiction structure 132 is a silicon-based semiconductor, the anti-stiction structure 132 has a relatively high yield stress. Because the anti-stiction structure has a relatively high yield stress, a relatively large impact force on the anti-stiction structure (e.g., via the movable mass 126) may not deform the anti-stiction structure 132 (e.g., may not cause plastic deformation of the anti-stiction structure 132). Accordingly, the anti-stiction structure 132 may improve the mechanical robustness of the MEMS device 100, thereby expanding real-world applications (e.g., high-impact resistant MEMS devices) and/or improving device performance (e.g., improving sensing performance over the lifetime of the MEMS device).

In some embodiments, the chemical composition of the anti-stiction structure 132 is different than the chemical composition of the lower bond ring 118. For example, the lower bond ring 118 may comprise titanium and the anti-stiction structure 132 may be polycrystalline silicon. In further embodiments, the chemical composition of the anti-stiction structure 132 is different than both the first sensing electrode 128 and the lower bond ring 118.

Figure 2:
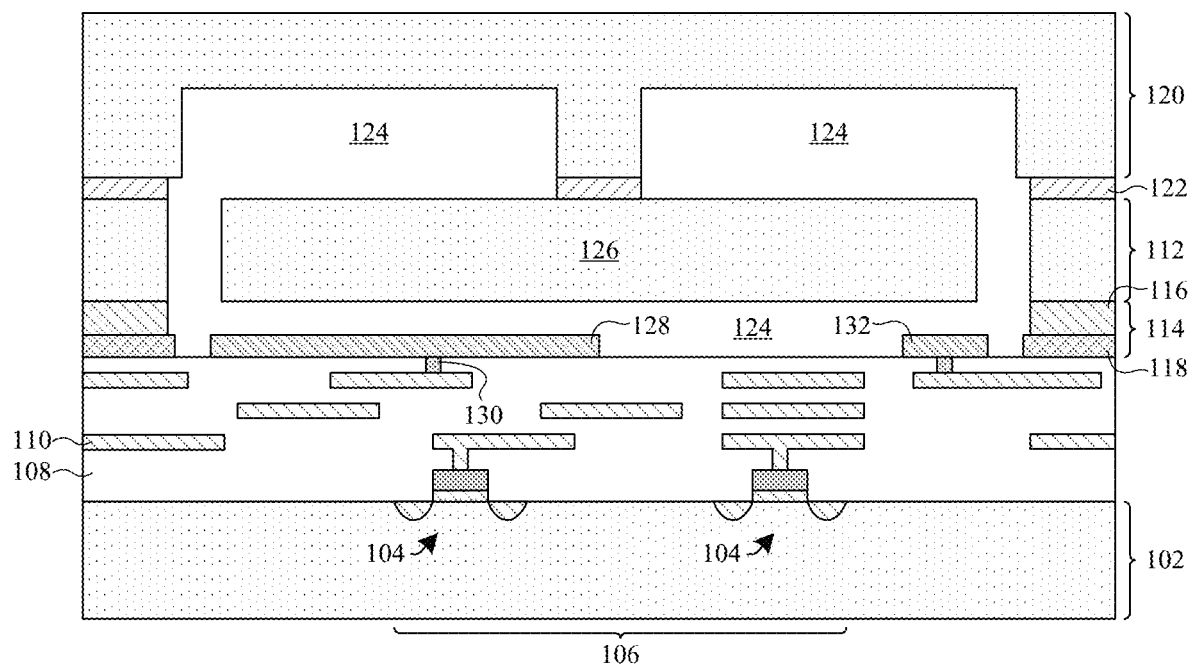
FIG. 2 illustrates a cross-sectional view of some other embodiments of the MEMS device of FIG. 1.

FIG. 2 illustrates a cross-sectional view of some other embodiments of the MEMS device 100 of FIG. 1.

As shown in FIG. 2, the anti-stiction structure 132 is electrically coupled to the interconnect structure 110. In some embodiments, the anti-stiction structure 132 is electrically coupled to one or more upper conductive vias of the plurality of upper conductive vias 130 (e.g., one or more metal vias). The interconnect structure 110 may electrically couple the anti-stiction structure 132 to the sensing circuit 106. In further embodiments, the sensing circuit 106 is configured to measure and analyze a change in capacitive coupling between the movable mass 126 and the anti-stiction structure 132 to derive a measurement of a physical quantity (e.g., acceleration) associated with a change in distance between the movable mass 126 and the anti-stiction structure 132. In yet further embodiments, the interconnect structure 110 may electrically couple the anti-stiction structure to a specific electrical connection (e.g., 5 volts, 0 volts, etc.)

Because the anti-stiction structure 132 is electrically conductive and is electrically coupled to the sensing circuit 106, the anti-stiction structure 132 may be utilized as a sensing electrode. In such embodiments, the anti-stiction structure 132 may be spaced from the first sensing electrode 128 and be utilized as a second sensing electrode in conjunction with the first sensing electrode 128. Because the anti-stiction structure 132 may be utilized as a second sensing electrode in conjunction with the first sensing electrode 128, the performance of the MEMS device 100 may be improved (e.g., increasing sensitivity, improving accuracy, decreasing incorrect sensing errors, etc.). In other such embodiments, the anti-stiction structure 132 may be utilized as the first sensing electrode 128. In other words, the anti-stiction structure 132 and the first sensing electrode 128 may be a same structure. Because the anti-stiction structure 132 may be utilized as the first sensing electrode 128, a cost to fabricate the MEMS device 100 may be reduced (e.g., reducing a number of photolithography/deposition processes, reducing an amount of deposited material, etc.).

Also shown in FIG. 2, the first sensing electrode 128 and the anti-stiction structure 132 may comprise a same material. For example, both the first sensing electrode 128 and the anti-stiction structure 132 may comprise silicon. In further embodiments, both the first sensing electrode 128 and the anti-stiction structure 132 may consist essentially of silicon. Because the first sensing electrode 128 and the anti-stiction structure 132 may comprise a same material, a cost to fabricate the MEMS device 100 may be reduced (e.g., reducing a number of photolithography/deposition processes). In some embodiments, the chemical composition of the first sensing electrode 128 is different than the chemical composition of the lower bond ring 118.

In some embodiments, both the first sensing electrode 128 and the anti-stiction structure 132 may be a silicon-based semiconductor. In other embodiments, the anti-stiction structure 132 and the first sensing electrode 128 may have a different chemical composition (e.g., Si and TiN, respectively). In further embodiments, the anti-stiction structure 132 and the first sensing electrode 128 may have a same crystalline structure. For example, both the anti-stiction structure 132 and the first sensing electrode 128 may be amorphous solid (e.g., amorphous silicon), a crystalline solid (e.g., monocrystalline silicon, polycrystalline silicon, etc.), a monocrystalline solid (e.g., monocrystalline silicon), or a polycrystalline solid (e.g., polycrystalline silicon). Because the first sensing electrode 128 and the anti-stiction structure 132 may have a same crystalline structure, a cost to fabricate the MEMS device 100 may be reduced (e.g., reducing a number of photolithography processes). In other embodiments, the anti-stiction structure 132 and the first sensing electrode 128 may have a different crystalline structure. For example, the anti-stiction structure 132 may be a crystalline solid and the first sensing electrode 128 may be an amorphous solid, or vice versa.

Figure 3:
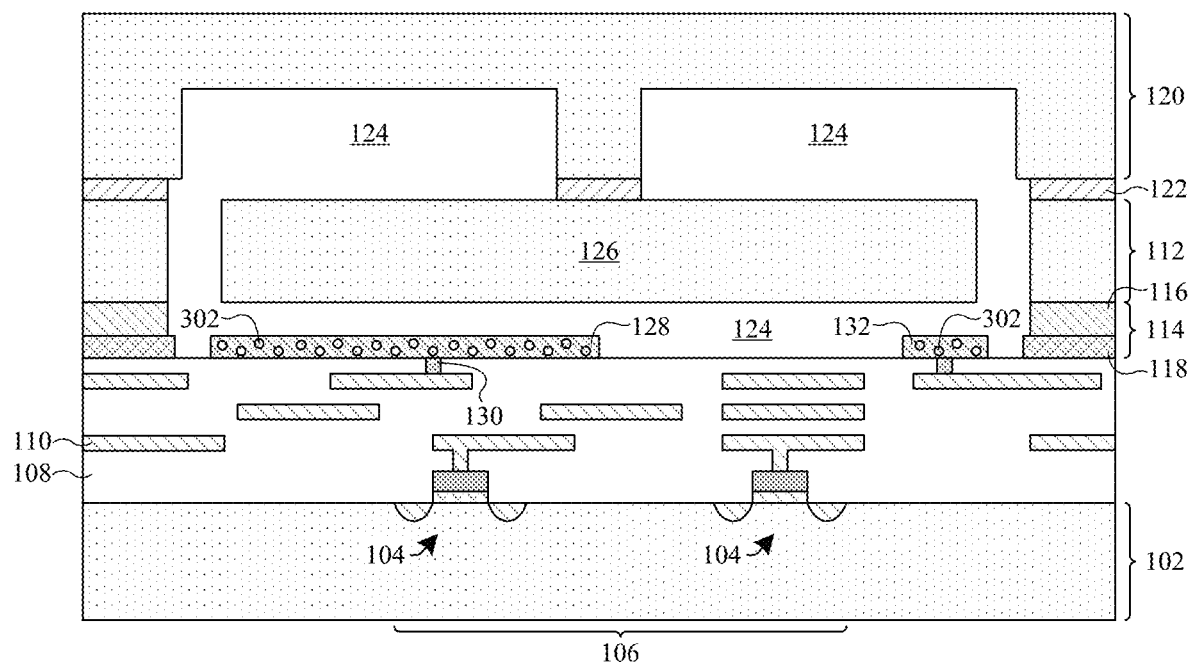
FIG. 3 illustrates a cross-sectional view of some other embodiments of the MEMS device of FIG. 1.

FIG. 3 illustrates a cross-sectional view of some other embodiments of the MEMS device 100 of FIG. 1.

As shown in FIG. 3, the anti-stiction structure 132 comprises one or more outgassing species 302. In some embodiments, the outgassing species may be, for example, argon (A), hydrogen (H), nitrogen (N), some other outgassing species, or a combination of the foregoing. The one or more outgassing species 302 are configured to increase a pressure inside the cavity 124 after the cavity 124 is sealed (or during sealing of the cavity 124). In such embodiments, the one or more outgassing species 302 may increase the pressure inside the cavity 124 by outgassing from the anti-stiction structure 132 into the cavity 124. Because the anti-stiction structure 132 may comprise the one or more outgassing species 302, a cost to fabricate the MEMS device 100 may be reduced (e.g., reducing a number of photolithography/deposition/implantation processes to form a discrete outgassing structure). Further, because the anti-stiction structure 132 is a silicon-based semiconductor, the anti-stiction structure 132 may have improve outgassing properties over other materials (e.g., a silicon-based semiconductor outgassing structure may provide more efficient outgassing of the one or more outgassing species 302 than a metal-based outgassing structure).

In some embodiments, the first sensing electrode 128 comprises the one or more outgassing species 302. Because the first sensing electrode 128 may comprise the one or more outgassing species 302, a cost to fabricate the MEMS device 100 may be reduced (e.g., reducing a number of photolithography/deposition/implantation processes to form a discrete outgassing structure). In further embodiments, both first sensing electrode 128 and the anti-stiction structure 132 comprise the one or more outgassing species 302. Because the anti-stiction structure 132 and the first sensing electrode 128 may comprise the one or more outgassing species 302, the pressure inside the cavity 124 may be improved (e.g., increased pressure, improved control over the pressure, etc.). The first sensing electrode 128 and the anti-stiction structure 132 may comprise the same one or more outgassing species 302 and/or a same concentration of the one or more outgassing species 302. In other embodiments, the first sensing electrode 128 may comprise a first collection (or concentration) of the one or more outgassing species 302 and the anti-stiction structure 132 may comprise a second collection (or concentration) of the one or more outgassing species 302 different than the first collection (or concentration).

Figure 4:
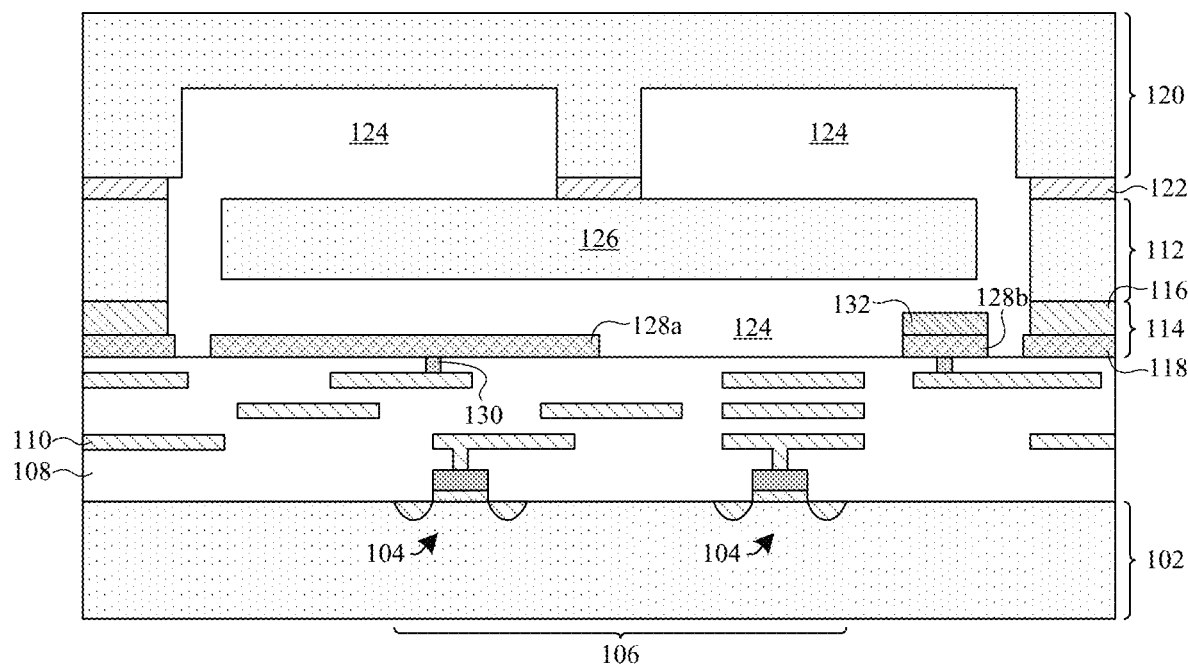
FIG. 4 illustrates a cross-sectional view of some other embodiments of the MEMS device of FIG. 1.

FIG. 4 illustrates a cross-sectional view of some other embodiments of the MEMS device 100 of FIG. 1.

As shown in FIG. 4, in some embodiments, the MEMS device 100 comprises a plurality of sensing electrodes 128a-b. For example, the MEMS device may comprise a third sensing electrode 128a and a fourth sensing electrode 128b. It will be appreciated that, in some embodiments, each of the plurality of sensing electrodes 128a-b may comprise the features (e.g., structural features, chemical composition, etc.) described for the first sensing electrode 128, or vice versa. In some embodiments, upper surfaces of the plurality of sensing electrodes 128a-b are coplanar.

The third sensing electrode 128a and the fourth sensing electrode 128b may have a same chemical composition. In other embodiments, the third sensing electrode 128a has a different chemical composition than the fourth sensing electrode 128b. In some embodiments, the third sensing electrode 128a and the fourth sensing electrode 128b have a same crystalline structure. In other embodiments, the third sensing electrode 128a and the fourth sensing electrode 128b may have a different crystalline structure.

In some embodiments, the anti-stiction structure 132 may be disposed on the fourth sensing electrode 128b. It will be appreciated that, in some embodiments, the anti-stiction structure 132 may be disposed on the third sensing electrode 128a, or a plurality of anti-stiction structures may be disposed on the plurality of sensing electrodes 128a-b, respectively. The anti-stiction structure 132 is disposed between the movable element and the fourth sensing electrode 128b. In some embodiments, the anti-stiction structure 132 has an upper surface disposed above an upper surface of the fourth sensing electrode 128b. In further embodiments, opposite sidewalls of the anti-stiction structure 132 are substantially aligned with opposite sidewalls of the fourth sensing electrode 128b, respectively. In yet further embodiments, a thickness of the movable mass 126 is less than thicknesses of adjacent portions of the second semiconductor substrate 112. In such embodiments, the movable mass 126 may have a bottommost surface disposed between a bottommost surface of the adjacent portions of the second semiconductor substrate 112.

Figure 5:
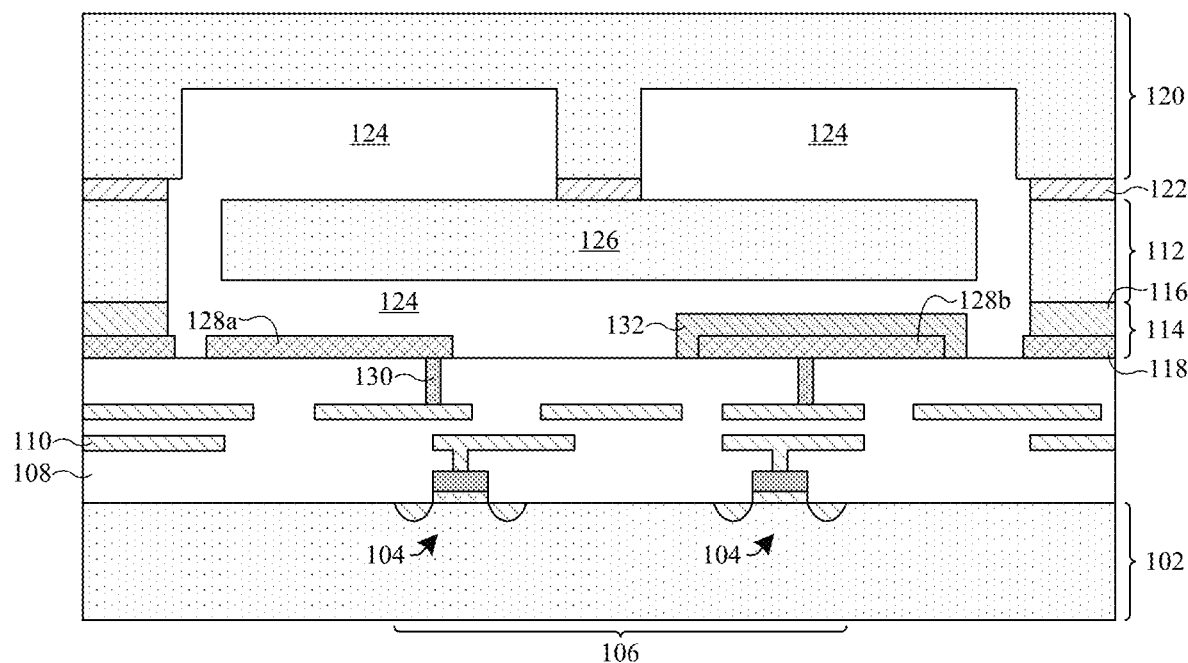
FIG. 5 illustrates a cross-sectional view of some other embodiments of the MEMS device of FIG. 1.

FIG. 5 illustrates a cross-sectional view of some other embodiments of the MEMS device 100 of FIG. 1.

In some embodiments, outermost sidewalls of the fourth sensing electrode 128b are disposed between outermost sidewalls of the anti-stiction structure 132. In further embodiments, the anti-stiction structure 132 may extend vertically along the outermost sidewalls of the fourth sensing electrode 128b. In yet further embodiments, the anti-stiction structure 132 may cover the upper surface of the fourth sensing electrode 128b and sidewalls of the fourth sensing electrode 128b. The anti-stiction structure 132 may contact both the ILD structure 108 and the fourth sensing electrode 128b.

Figure 6:
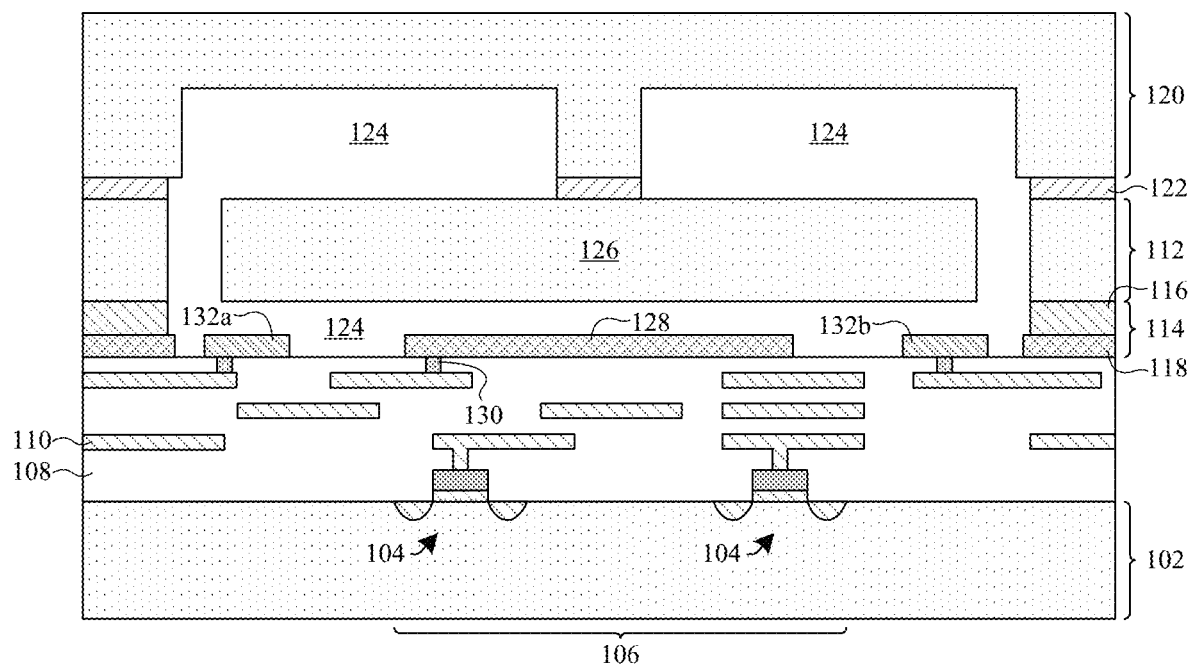
FIG. 6 illustrates a cross-sectional view of some other embodiments of the MEMS device of FIG. 1.

FIG. 6 illustrates a cross-sectional view of some other embodiments of the MEMS device 100 of FIG. 1.

As shown in FIG. 6, in some embodiments, the MEMS device 100 comprises a plurality of anti-stiction structures 132a-c. For example, the MEMS device may comprise a first anti-stiction structure 132a, a second anti-stiction structure 132*b*, and a third anti-stiction structure 132*c* (not shown in FIG. 6). It will be appreciated that, in some embodiments, each of the plurality of anti-stiction structures 132*a-c* may comprise the features (e.g., structural features, chemical composition, etc.) described for the anti-stiction structure 132, or vice versa. In some embodiments, the first anti-stiction structure 132*a* and the second anti-stiction structure 132*b* have a same chemical composition. In further embodiments, the first anti-stiction structure 132*a* and the second anti-stiction structure 132*b* have a same crystalline structure. In other embodiments, the first anti-stiction structure 132*a* and the second anti-stiction structure 132*b* may have a different crystalline structure.

In some embodiments, the first sensing electrode 128 is disposed between two or more of the plurality of anti-stiction structures 132*a-c*. For example, the first sensing electrode 128 may be disposed between the first anti-stiction structure 132*a* and the second anti-stiction structure 132*b*. The plurality of anti-stiction structures 132*a-c* may have upper surfaces that are coplanar with an upper surface of the first sensing electrode 128.

Figure 7:
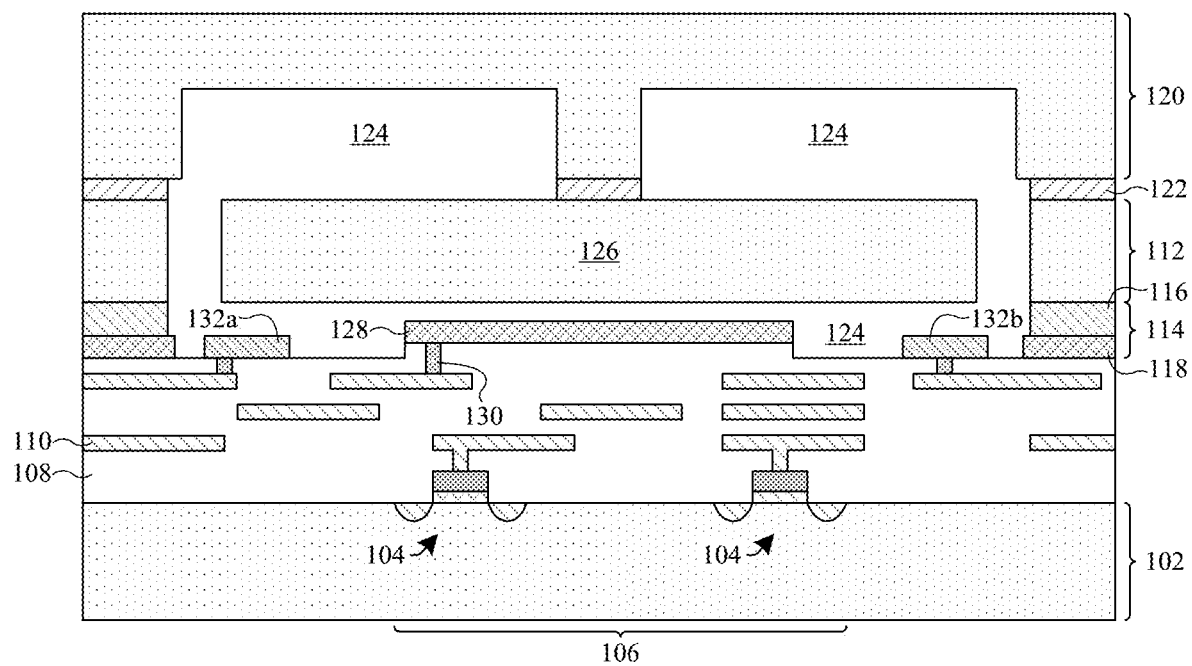
FIG. 7 illustrates a cross-sectional view of some other embodiments of the MEMS device of FIG. 1.

FIG. 7 illustrates a cross-sectional view of some other embodiments of the MEMS device 100 of FIG. 1.

As shown in FIG. 7, the upper surfaces of the plurality of anti-stiction structures 132*a-c* are disposed below the upper surface of the first sensing electrode 128. In some embodiments, the upper surfaces of the plurality of anti-stiction structures 132*a-c* are disposed between the upper surface of the first sensing electrode 128 and a bottom surface of the first sensing electrode 128. In other embodiments, the upper surfaces of the plurality of anti-stiction structures 132*a-c* are disposed below the bottom surface of the first sensing electrode 128. In further embodiments, the first sensing electrode 128 are disposed on a first portion of the ILD structure 108 and the plurality of anti-stiction structures 132*a-c* may be disposed on a plurality of second portions of the ILD structure 108. The first portion of the ILD structure 108 may have an upper surface that is disposed above upper surfaces of the plurality of second portions of the ILD structure 108.

Figure 8:
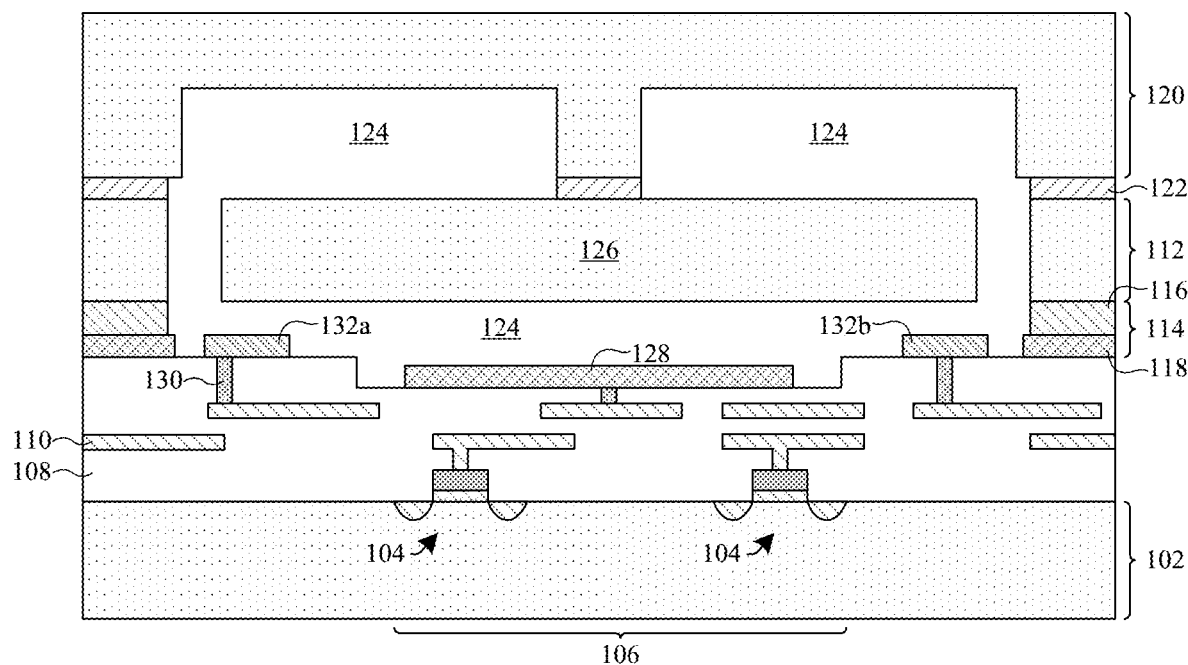
FIG. 8 illustrates a cross-sectional view of some other embodiments of the MEMS device of FIG. 1.

FIG. 8 illustrates a cross-sectional view of some other embodiments of the MEMS device 100 of FIG. 1.

As shown in FIG. 8, the upper surfaces of the plurality of anti-stiction structures 132*a-c* are disposed above the upper surfaces of the first sensing electrode 128. In some embodiments, the bottom surfaces of the plurality of anti-stiction structures 132*a-c* are disposed above the upper surface of the first sensing electrode 128. In other embodiments, the bottom surfaces of the plurality of anti-stiction structures 132*a-c* are disposed between the upper surface of the first sensing electrode 128 and the bottom surface of the first sensing electrode 128. In further embodiments, the upper surface of the first portion of the ILD structure 108 is disposed below the upper surfaces of the plurality of second portions of the ILD structure 108. In yet further embodiments, the upper surface of the first sensing electrode 128 is disposed below an uppermost surface of the ILD structure 108. In other embodiments, the uppermost surface of the ILD structure 108 may be disposed between the upper surface of the first sensing electrode 128 and the bottom surface of the first sensing electrode 128.

Figure 9:
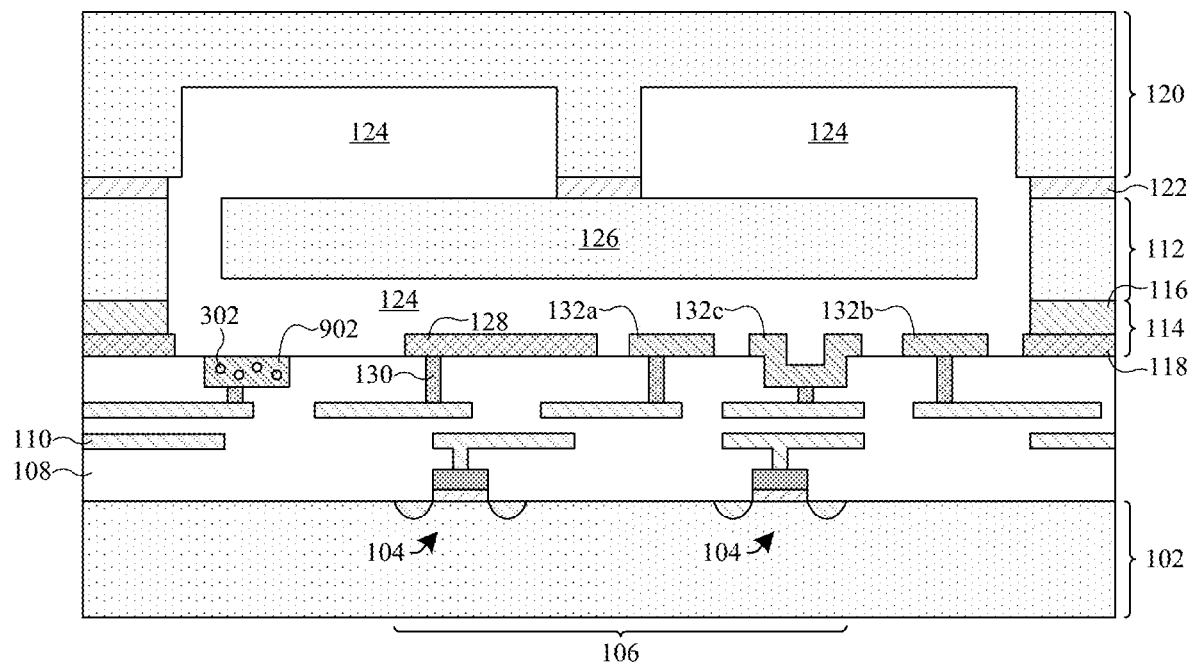
FIG. 9 illustrates a cross-sectional view of some other embodiments of the MEMS device of FIG. 1.

FIG. 9 illustrates a cross-sectional view of some other embodiments of the MEMS device 100 of FIG. 1.

As shown in FIG. 9, the third anti-stiction structure 132*c* extends into the ILD structure 108. In some embodiments, a first upper surface of the third anti-stiction structure 132*c* is disposed below an upper surface of the ILD structure 108 and a second surface of the third anti-stiction structure 132*c* is disposed above the upper surface of the ILD structure 108. In further embodiments, the third anti-stiction structure 132*c* extend horizontally along the upper surface of the ILD structure 108. The third anti-stiction structure 132*c* may have a bottom surface disposed below bottom surfaces of the first anti-stiction structure 132*a*, the second anti-stiction structure 132*b*, and/or the first sensing electrode 128. In yet further embodiments, the plurality of anti-stiction structures 132*a-c* are disposed on a first side of the first sensing electrode 128.

In some embodiments, an outgassing structure 902 is disposed in the ILD structure 108. The outgassing structure 902 comprises the one or more outgassing species 302. In further embodiments, an upper surface of the outgassing structure 902 is coplanar with the upper surface of the ILD structure 108. The upper surface of the outgassing structure 902 may be disposed below the upper surface of the first sensing electrode 128 and/or one or more anti-stiction structures of the plurality of anti-stiction structures 132*a-c*. The upper surface of the outgassing structure 902 may be disposed below a bottom surface of the first sensing electrode 128 and/or one or more anti-stiction structures of the plurality of anti-stiction structures 132*a-c*. In yet further embodiments, the outgassing structure 902 may be electrically coupled to one or more of the plurality of upper conductive vias 130.

In some embodiments, the outgassing structure 902 comprises a semiconductor material. The outgassing structure 902 may comprise silicon. In such embodiments, the outgassing structure 902 may be referred to as a silicon-based outgassing structure. The outgassing structure 902 may consist essentially of silicon. In further embodiments, the outgassing structure 902 may be a silicon-based semiconductor. The outgassing structure 902 may be an amorphous solid. In other embodiments, the outgassing structure 902 may be a crystalline solid. The outgassing structure 902 may be a monocrystalline solid. The outgassing structure 902 may be a polycrystalline solid. Because the outgassing structure 902 is a silicon-based semiconductor, the outgassing structure 902 may have improved outgassing properties over other materials (e.g., a silicon-based semiconductor outgassing structure may provide more efficient outgassing of the one or more outgassing species 302 than a metal-based outgassing structure).

In some embodiments, the outgassing structure 902 and the plurality of anti-stiction structures 132*a-c* may have a same chemical composition. Because the outgassing structure 902 and the plurality of anti-stiction structures 132*a-c* may have a same chemical composition, a cost to fabricate the MEMS device 100 may be reduced (e.g., reducing a number of photolithography/deposition processes). In other embodiments, the outgassing structure 902 has a different chemical composition than the plurality of anti-stiction structures 132*a-c*. In further embodiments, the outgassing structure 902 and the plurality of anti-stiction structures 132*a-c* have a same crystalline structure. In other embodiments, the outgassing structure 902 and the plurality of anti-stiction structures 132*a-c* may have a different crystalline structure. In yet further embodiments, the outgassing structure 902 may be disposed on a second side of the first sensing electrode 128 opposite the first side of the first sensing electrode 128. In other embodiments, the outgassing structure 902 may be disposed on the first side of the first sensing electrode 128.

Figure 10:
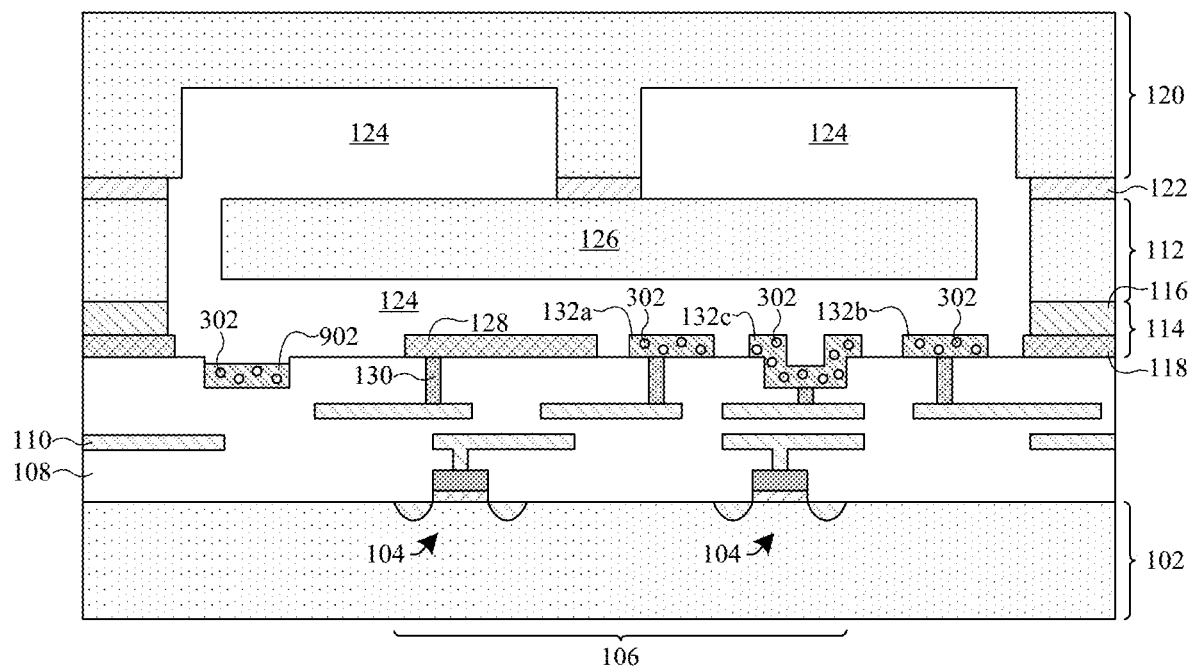
FIG. 10 illustrates a cross-sectional view of some other embodiments of the MEMS device of FIG. 1.

FIG. 10 illustrates a cross-sectional view of some other embodiments of the MEMS device 100 of FIG. 1.

As shown in FIG. 10, in some embodiments, the outgassing structure 902 and the plurality of anti-stiction structures 132a-c comprise the one or more outgassing species 302. For example, the first anti-stiction structure 132a, the second anti-stiction structure 132b, the third anti-stiction structure 132c, and the outgassing structure 902 may comprise the one or more outgassing species 302. In some embodiments, the outgassing structure 902 and the plurality of anti-stiction structures 132a-c may comprise the same one or more outgassing species 302 and/or the same concentration of the one or more outgassing species 302. In other embodiments, the outgassing structure 902 may comprise a third collection (or concentration) of the one or more outgassing species 302 and each of the plurality of anti-stiction structures 132a-c may comprise a fourth collection (or concentration) of the one or more outgassing species 302 different than the third collection (or concentration).

In some embodiments, the outgassing structure 902 may have an upper surface disposed below an upper surface of the ILD structure 108. In further embodiments, the outgassing structure 902 may not be electrically coupled to the interconnect structure 110. In such embodiments, the ILD structure 108 may contact the entire bottom surface of the outgassing structure 902.

FIGS. 11A-E illustrate various layout views of some embodiments of the anti-stiction structure 132 of FIG. 1.

Figure 11C:
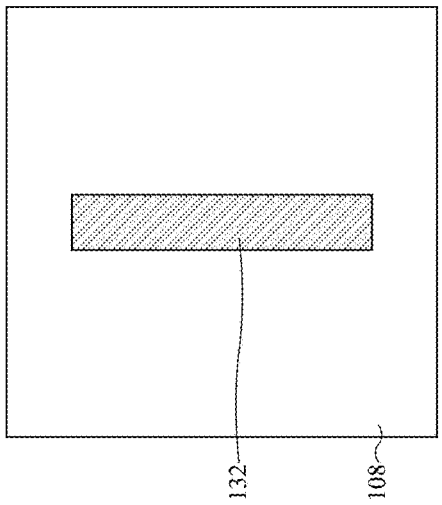
FIGS. 11A-E illustrate various layout views of some embodiments of the anti-stiction structure of FIG. 1.
Figure 11B:
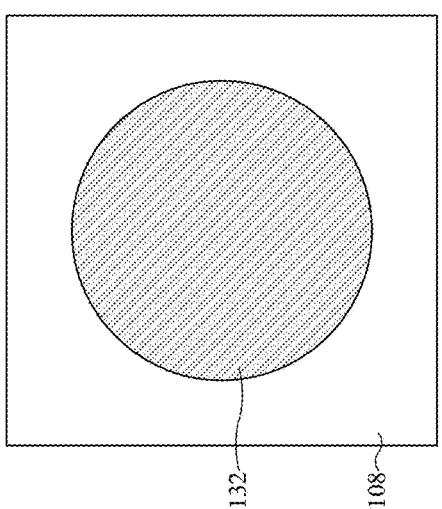
Figure 11A:
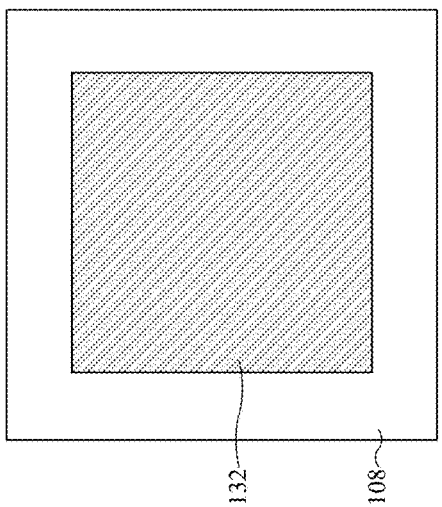
Figure 11E:
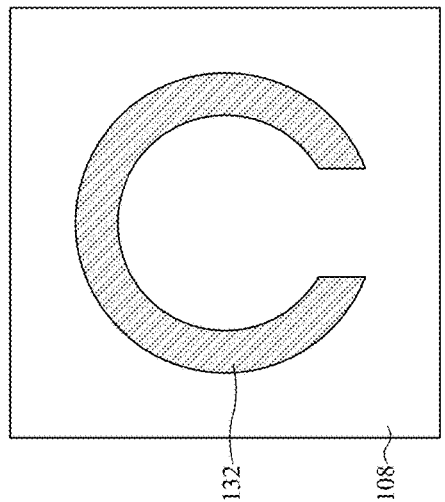
Figure 11D:
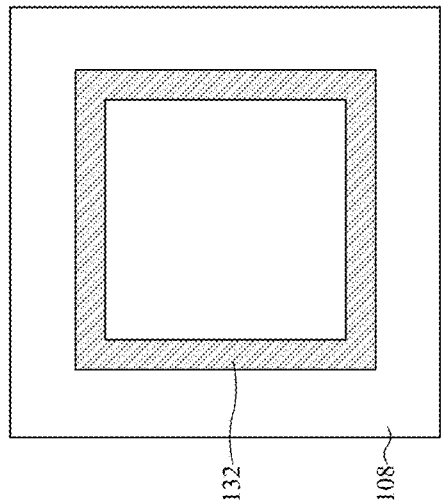

As shown in FIG. 11A, the anti-stiction structure 132 may have a square-shaped layout. As shown in FIG. 11B, the anti-stiction structure 132 may have a circular-shaped layout. As shown in FIG. 11C, the anti-stiction structure 132 may have a rectangular-shaped layout. As shown in FIG. 11D, the anti-stiction structure 132 may have a generally ring-shaped layout (e.g., square-shaped ring, circular-shaped ring, rectangular-shaped ring, etc.). As shown in FIG. 11E, the anti-stiction structure 132 may have a C-shaped layout. While FIGS. 11A-E illustrate the anti-stiction structure 132 having various geometrically-shaped layouts, it will be appreciated the anti-stiction structure 132 may have other geometrically-shaped layouts.

In some embodiments, the anti-stiction structure 132 may have a height (e.g., between an uppermost surface and a bottommost surface) between about 0.1 micrometers ($\mu m$) and about 10 $\mu m$. In further embodiments, the anti-stiction structure 132 may have a width between about 1 $\mu m$ and about 100 $\mu m$. In further embodiments, the anti-stiction structure 132 may have a length between about 1 $\mu m$ and about 100 $\mu m$. In yet further embodiments, the anti-stiction structure 132 may be disposed within an area having a length between about 1 $\mu m$ and about 100 $\mu m$ and a width between about 1 $\mu m$ and about 100 $\mu m$. It will be appreciated that the above height range, width range, length range, and area range are non-limiting examples, and depending on a size of the MEMS device 100 and/or an application of the MEMS device 100, the height of the anti-stiction structure 132, the width of the anti-stiction structure 132, the length of the anti-stiction structure 132, and/or the area in which the anti-stiction structure 132 is disposed may be outside the above ranges (e.g., less than or greater than the above ranges).

Figure 12B:
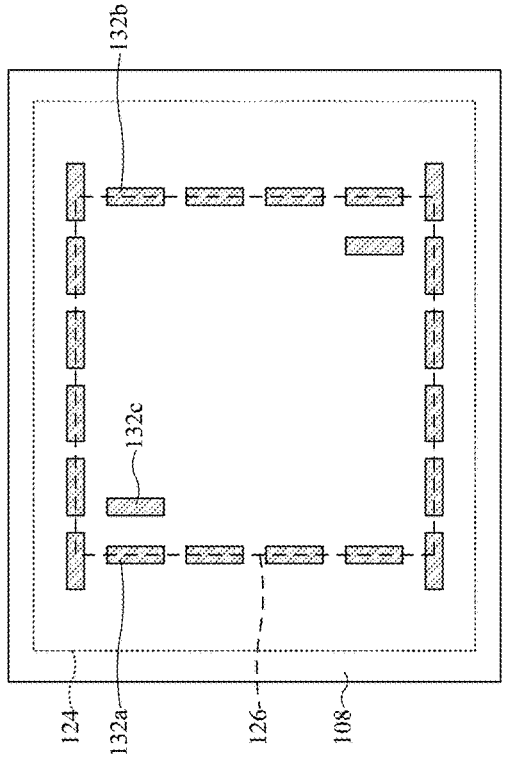
FIGS. 12A-C illustrate various simplified layout views of the MEMS device of FIG. 1.
Figure 12A:
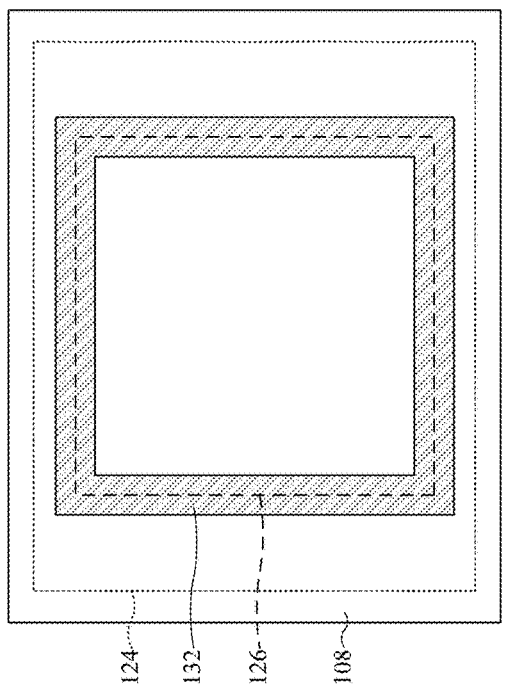
Figure 12C:
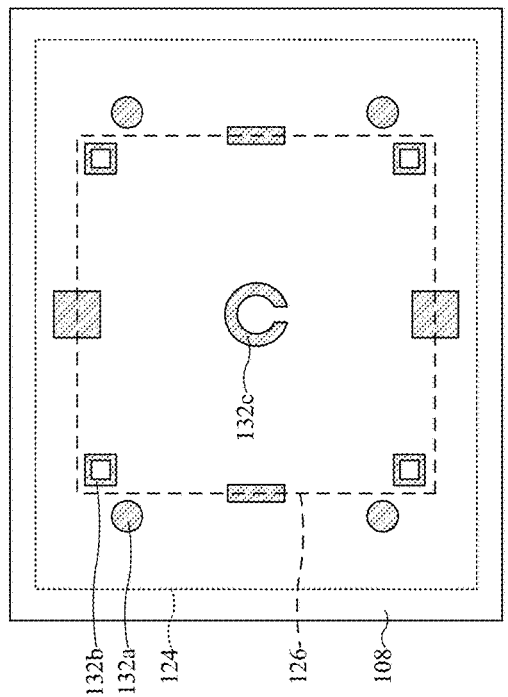

FIGS. 12A-C illustrate various simplified layout views of the MEMS device 100 of FIG. 1. FIGS. 12A-C are "simplified" because the third semiconductor substrate 120 is not shown, the second bond structure 122 is not shown, the second semiconductor substrate 112 is not shown, the first bond structure 114 is not shown, the interconnect structure 110 is not shown, the first sensing electrode 128 is not shown, a perimeter of the cavity 124 is illustrated by a first dashed line, and a perimeter of the movable mass 126 is illustrated by a second dashed line.

As shown in FIG. 12A, in some embodiments, the MEMS device 100 may only comprise a single anti-stiction structure 132. In further embodiments, a layout of the anti-stiction structure 132 may be vertically aligned with the perimeter of the movable mass 126. For example, the anti-stiction structure 132 may be disposed on the ILD structure 108, such that edges of the movable mass 126 are disposed between inner sidewalls and outer sidewalls of the anti-stiction structure 132. It other embodiments, the anti-stiction structure 132 may be disposed inside the perimeter of the movable mass 126 or outside the perimeter of the movable mass 126.

As shown in FIG. 12B, in some embodiments, the MEMS device 100 may comprise the plurality of anti-stiction structures 132a-c. In some embodiments, each of the plurality of anti-stiction structures 132a-c may have a same geometrically-shaped layout (e.g., a rectangular-shaped layout). The plurality of anti-stiction structures 132a-c may be vertically aligned with the perimeter of the movable mass 126. In other embodiments, the plurality of anti-stiction structures 132a-c may be disposed inside the perimeter of the movable mass 126 or outside the perimeter of the movable mass 126. In some embodiments, some of the anti-stiction structures of the plurality of anti-stiction structures 132a-c may be vertically aligned with the perimeter of the movable mass 126, and some other of the plurality of anti-stiction structures 132a-c may be disposed inside the perimeter of the movable mass 126 and/or outside the perimeter of the movable mass 126. For example, the first anti-stiction structure 132a and the second anti-stiction structure 132b may be vertically aligned with the perimeter of the movable mass 126, and the third anti-stiction structure 132c may be disposed inside the perimeter of the movable mass 126 (or outside the perimeter of the movable mass 126).

As shown in FIG. 12C, some of the plurality of anti-stiction structures 132a-c may have a different geometrically-shaped layout than some other of the plurality of anti-stiction structures 132a-c. For example, the first anti-stiction structure 132a may have a first geometrically-shaped layout (e.g., circular-shaped layout), the second anti-stiction structure 132b may have a second geometrically-shaped layout (e.g., square-shaped ring layout) different than the first geometrically-shaped layout, and the third anti-stiction structure 132c may have a third geometrically-shaped layout (e.g., C-shaped layout) different than the first geometrically-shaped layout and the second geometrically-shaped layout.

FIGS. 13-27 illustrate a series of cross-sectional views of some embodiments for forming the MEMS device 100 of FIG. 10.

Figure 13:
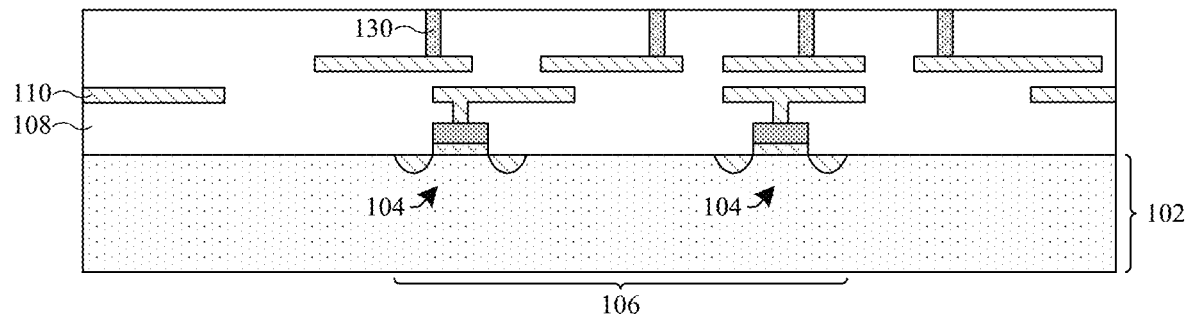
FIGS. 13-27 illustrate a series of cross-sectional views of some embodiments for forming the MEMS device of FIG. 10.

As shown in FIG. 13, an interlayer dielectric (ILD) structure 108 is disposed over a first semiconductor substrate 102. An interconnect structure 110 is disposed in the ILD structure 108. Further, the interconnect structure 110 comprises a plurality of upper conductive vias 130. Moreover, one or more semiconductor devices 104 are disposed on/in the first semiconductor substrate 102.

In some embodiments, a method for forming the structure illustrated in FIG. 13 comprises forming the one or more semiconductor devices 104 by forming pairs of source/drain regions in the first semiconductor substrate 102 (e.g., via ion implantation). Thereafter, gate dielectrics and gate electrodes are formed over the first semiconductor substrate 102 and between the pairs of source/drain regions (e.g., via deposition/growth processes and etching processes). A first ILD layer is then formed over the one or more semiconductor devices 104, and contact openings are formed in the first ILD. A conductive material (e.g., W) is formed on the first ILD layer and in the contact openings. Thereafter, a planarization process (e.g., chemical-mechanical polishing (CMP)) is performed into the conductive material to form conductive contacts (e.g., metal contacts) in the first ILD layer.

A second ILD layer is then formed over the first ILD layer and the conductive contacts, and first conductive line trenches are formed in the second ILD layer. A conductive material (e.g., Cu) is formed on the second ILD layer and in the first conductive line trenches. Thereafter, a planarization process (e.g., CMP) is performed into the conductive material to form a conductive line (e.g., metal 1) in the second ILD. A third ILD layer is then formed over the second ILD layer and the conductive line, and conductive via openings are formed in the third ILD layer. A conductive material (e.g., Cu) is formed on the third ILD layer and in the conductive via openings. Thereafter, a planarization process (e.g., CMP) is performed into the conductive material to form conductive vias (e.g., metal vias) in the third ILD. The above processes for forming the conductive line and the conductive vias may be repeated any number of times to form the interconnect structure 110. In some embodiments, formation of the plurality of upper conductive vias 130 (e.g., via the above process for forming conductive vias) completes formation of the interconnect structure 110. In other embodiments, formation of an upper conductive line (e.g., top metal) completes formation of the interconnect structure 110. In further embodiments, the above layers and/or structures may be formed using a deposition or growth process, such as chemical vapor deposition (CVD), physical vapor deposition (PVD), atomic layer deposition (ALD), thermal oxidation, sputtering, electrochemical plating, electroless plating, some other deposition or growth process, or a combination of the foregoing.

Figure 14:
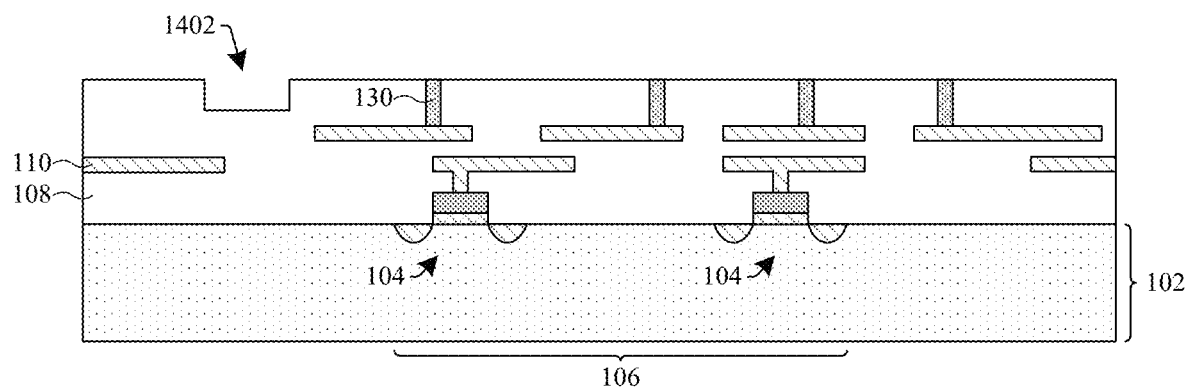

As shown in FIG. 14, a first opening 1402 is formed in the ILD structure 108. In some embodiments, a process for forming the first opening 1402 comprises forming a patterned masking layer (not shown) (e.g., negative/positive photoresist) on the ILD structure 108 and the upper conductive vias 130 (e.g., via a deposition process and photolithography process). Thereafter, the ILD structure 108 is exposed to an etchant (e.g., wet/dry etchant) to remove unmasked portions of the ILD structure 108, thereby forming the first opening 1402.

Figure 15:
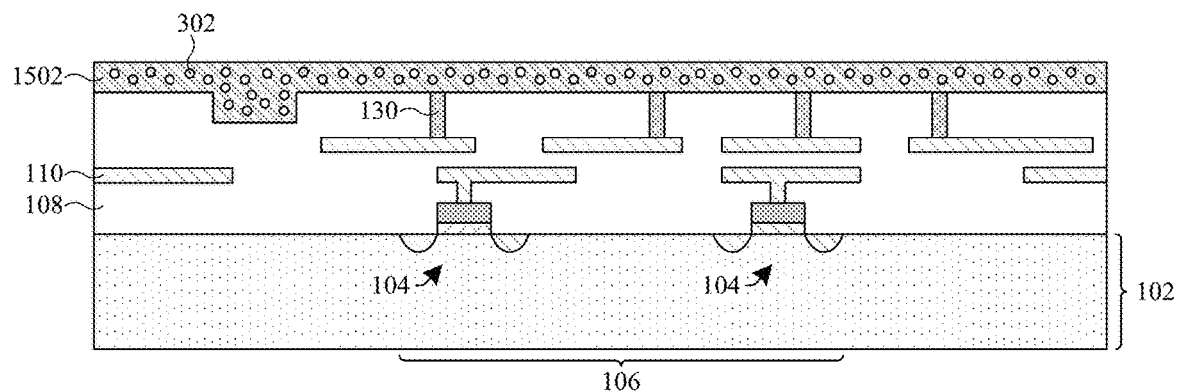

As shown in FIG. 15, an outgassing layer 1502 is formed on the ILD structure 108, on the plurality of upper conductive vias 130, and in the first opening 1402 (see, e.g., FIG. 14). The outgassing layer 1502 comprises one or more outgassing species 302. The outgassing species may be, for example, argon (A), hydrogen (H), nitrogen (N), some other outgassing species, or a combination of the foregoing. In further embodiments, the outgassing layer 1502 comprises a semiconductor material. The outgassing layer 1502 may comprise silicon. In such embodiments, the outgassing layer 1502 may be referred to as a silicon-based outgassing layer. The outgassing layer 1502 may consist essentially of silicon. In yet further embodiments, the outgassing layer 1502 may be a silicon-based semiconductor. The outgassing layer 1502 may be an amorphous solid. In other embodiments, the outgassing layer 1502 may be a crystalline solid. The outgassing layer 1502 may be a monocrystalline solid. The outgassing layer 1502 may be a polycrystalline solid.

In some embodiments, a process for forming the outgassing layer 1502 comprises depositing the outgassing layer 1502 on the ILD structure 108, on the plurality of upper conductive vias 130, and in the first opening 1402. The outgassing layer 1502 may be deposited by, for example, sputtering, CVD, PVD, ALD, some other deposition process, or a combination of the foregoing. In further embodiments, the one or more outgassing species 302 are formed in the outgassing layer 1502 during (or after) formation of the outgassing layer 1502. For example, the one or more outgassing species 302 may be pumped into a processing chamber during deposition of the outgassing layer 1502, thereby forming the outgassing layer 1502 with the one or more outgassing species 302 in the outgassing layer 1502.

Figure 16:
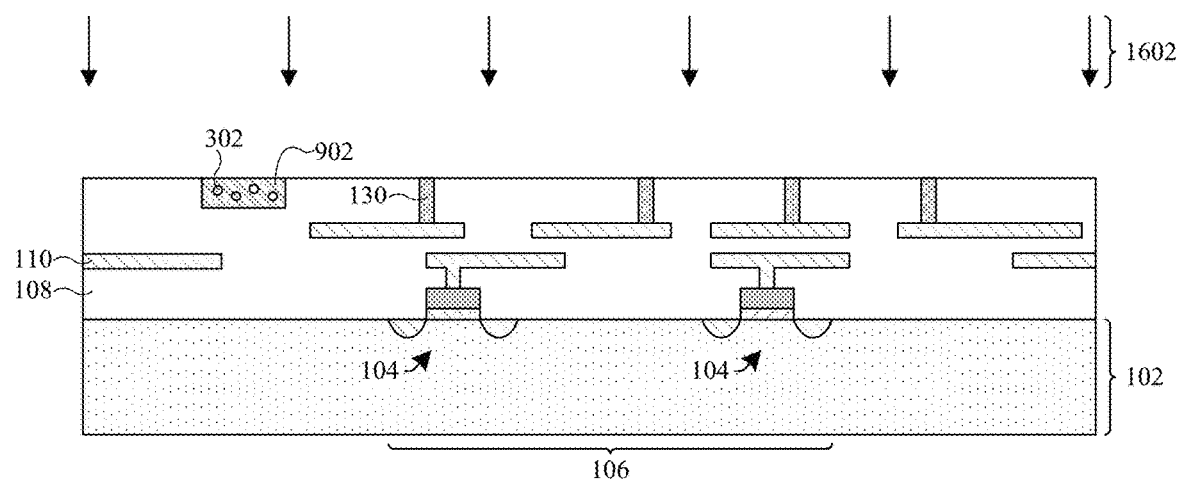

As shown in FIG. 16, an outgassing structure 902 is formed in the ILD structure 108. In some embodiments, the outgassing structure 902 is formed with an upper surface that is coplanar with an upper surface of the ILD structure 108. In some embodiments, a process for forming the outgassing structure 902 comprises performing a planarization process 1602 (e.g., CMP) on the outgassing layer 1502 (see, e.g., FIG. 15) to remove an upper portion of the outgassing layer 1502, thereby forming the outgassing structure 902. In yet further embodiments, the planarization process 1602 may be performed on the outgassing layer 1502 and the ILD structure 108 to co-planarize upper surfaces of the outgassing structure 902 and the ILD structure 108. In some embodiments, the process to form the outgassing structure 902 may be referred to as a damascene formation process.

Figure 17:
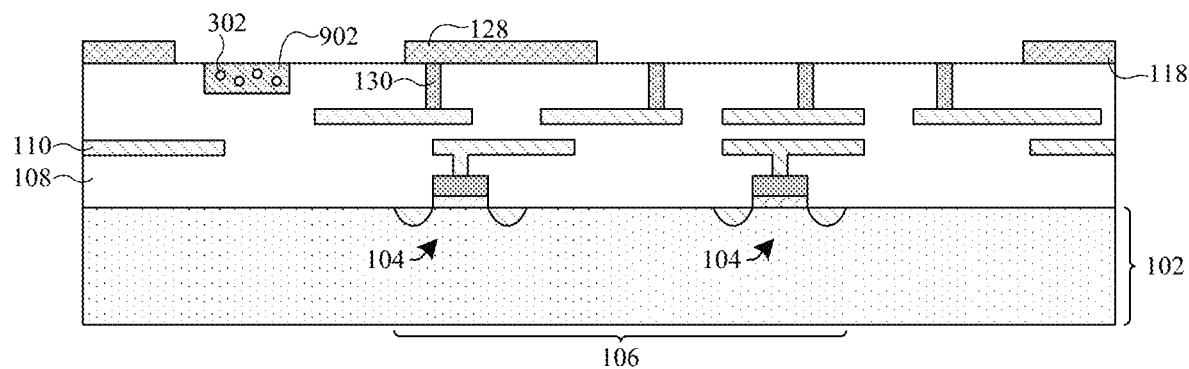

As shown in FIG. 17, a first sensing electrode 128 and a lower bond ring 118 are formed over the ILD structure 108. In some embodiments, a process for forming the first sensing electrode 128 and the lower bond ring 118 comprises depositing a conductive layer (not shown) on the ILD structure 108, the outgassing structure 902, and the plurality of upper conductive vias 130. The conductive layer may be deposited by, for example, CVD, PVD, ALD, sputtering, electrochemical plating, electroless plating, donor wafer bonding deposition (e.g., bonding a single crystal silicon SOI wafer to the ILD structure 108), some other deposition process, or a combination of the foregoing. A patterned masking layer (not shown) is then formed on the conductive layer. Thereafter, the conductive layer is exposed to an etchant to remove unmasked portions of the conductive layer, thereby forming the first sensing electrode 128 and the lower bond ring 118. Subsequently, in some embodiments, the patterned masking layer is stripped away.

It will be appreciated that a plurality of conductive layers, a plurality of patterned masking layers, and a plurality of etching process (e.g., exposing a layer to an etchant) may be utilized to form the first sensing electrode 128 and the lower bond ring 118. For example, a first conductive layer (e.g., Si) may be deposited on the ILD structure 108, the outgassing structure 902, and the plurality of upper conductive vias 130. In some embodiments, the first conductive layer may be formed with the one or more outgassing species 302 in the first layer. A first patterned masking layer is then formed on the first conductive layer. Thereafter, the first conductive layer is exposed to a first etchant to remove unmasked portions of the first conductive layer, thereby forming the first sensing electrode 128. Subsequently, in some embodiments, the first patterned masking layer is stripped away.

A second conductive layer (e.g., TiN) is then deposited on the ILD structure 108, the outgassing structure 902, the plurality of upper conductive vias 130, and the first sensing electrode 128. A second patterned masking layer is then formed on the second conductive layer. Thereafter, the second conductive layer is exposed to a second etchant to remove unmasked portions of the second conductive layer, thereby forming the lower bond ring 118. Subsequently, in some embodiments, the second patterned masking layer is stripped away. It will be appreciated that, in some embodiments, the lower bond ring 118 may be formed before the first sensing electrode 128.

Figure 18:
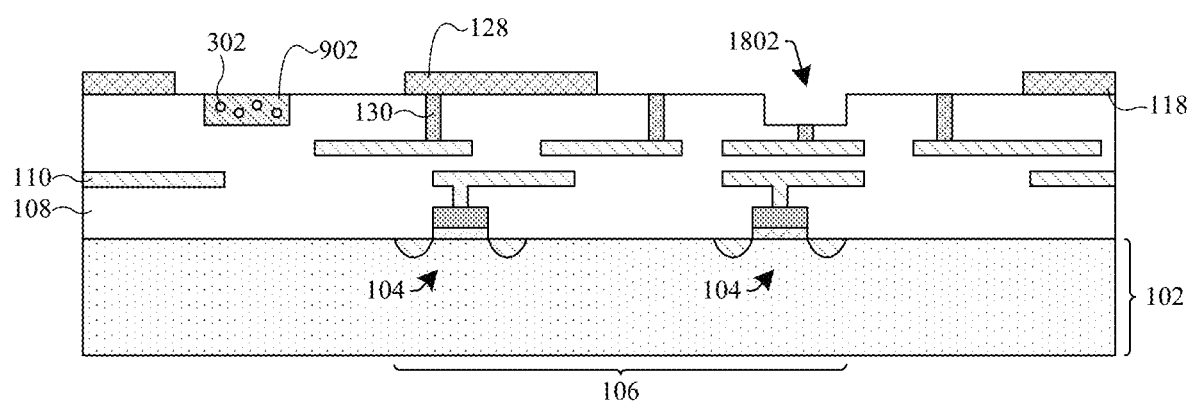

As shown in FIG. 18, a second opening 1802 is formed in the ILD structure 108. In some embodiments, a process for forming the second opening 1802 comprises forming a patterned masking layer (not shown) on the ILD structure 108, the outgassing structure 902, the first sensing electrode 128, the lower bond ring 118, and the upper conductive vias 130. Thereafter, the ILD structure 108 is exposed to an etchant to remove unmasked portions of the ILD structure 108 and unmasked portions of the plurality of upper conductive vias 130, thereby forming the second opening 1802.

It will be appreciated that, in some embodiments, the ILD structure 108 may comprise a plurality of ILD layers in which one or more of the plurality of upper conductive vias 130 are disposed. For example, a first upper conductive via of the plurality of upper conductive vias 130 may be disposed in a first ILD layer. The first upper conductive via has a first height. A second ILD layer may be disposed on the first ILD layer and the first upper conductive via. A second upper conductive via of the plurality of upper conductive vias 130 may be disposed in both the first ILD layer and the second ILD layer. The second upper conductive via has a second height greater than the first height. In further embodiments, the second opening 1802 may be formed over the first upper conductive via and in the second ILD layer.

Figure 19:
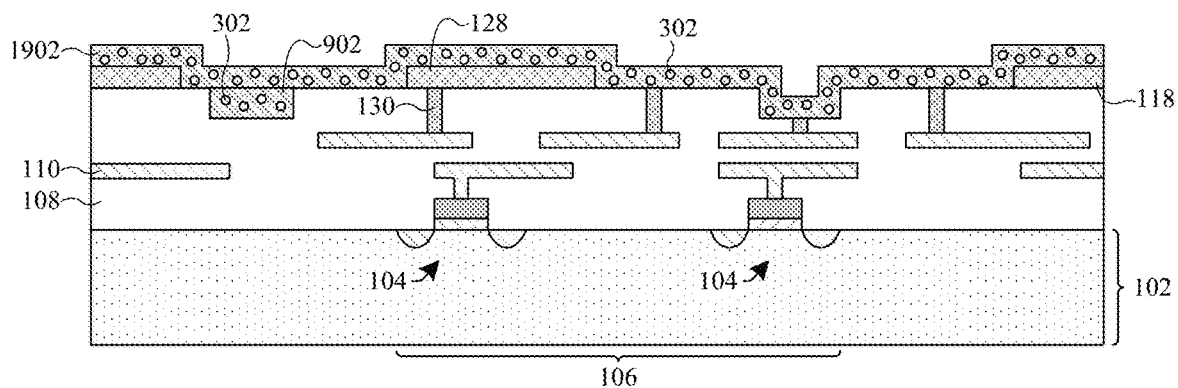

As shown in FIG. 19, an anti-stiction layer 1902 is formed over the ILD structure 108, the first sensing electrode 128, the lower bond ring 118, the outgassing structure 902, and the plurality of upper conductive vias 130. The anti-stiction layer 1902 comprises a semiconductor material. The anti-stiction layer 1902 may comprise silicon. In such embodiments, the anti-stiction layer 1902 may be referred to as a silicon-based anti-stiction layer. The anti-stiction layer 1902 may consist essentially of silicon. In yet further embodiments, the anti-stiction layer 1902 may be a silicon-based semiconductor. The anti-stiction layer 1902 may be an amorphous solid. In other embodiments, the anti-stiction layer 1902 may be a crystalline solid. The anti-stiction layer 1902 may be a monocrystalline solid. The anti-stiction layer 1902 may be a polycrystalline solid.

In some embodiments, the anti-stiction layer 1902 and the first sensing electrode 128 may be a silicon-based semiconductor. In other embodiments, the anti-stiction layer 1902 and the first sensing electrode 128 may have a different chemical composition (e.g., Si and TiN, respectively). In some embodiments, the anti-stiction layer 1902 and the first sensing electrode 128 may have a same crystalline structure. For example, both the anti-stiction layer 1902 and the first sensing electrode 128 may be an amorphous solid (e.g., amorphous silicon), a crystalline solid (e.g., monocrystalline silicon, polycrystalline silicon, etc.), a monocrystalline solid (e.g., monocrystalline silicon), or a polycrystalline solid (e.g., polycrystalline silicon). In other embodiments, the anti-stiction layer 1902 and the first sensing electrode 128 may have a different crystalline structure. For example, the anti-stiction layer 1902 may be a crystalline solid and the first sensing electrode 128 may be an amorphous solid, or vice versa.

In some embodiments, the anti-stiction layer 1902 may comprise one or more outgassing species 302. The first sensing electrode 128 and the anti-stiction layer 1902 may comprise the same one or more outgassing species 302 and/or same concentration of the one or more outgassing species 302. In other embodiments, the first sensing electrode 128 may comprise a first collection (or concentration) of the one or more outgassing species 302, and the anti-stiction layer 1902 may comprise a second collection (or concentration) of the one or more outgassing species 302 different than the first collection (or concentration).

In some embodiments, a process for forming the anti-stiction layer 1902 comprises depositing the anti-stiction layer 1902 on the ILD structure 108, on the lower bond ring 118, on the first sensing electrode 128, on the outgassing structure 902, on the plurality of upper conductive vias 130, and lining the second opening 1802 (see, e.g., FIG. 18). The anti-stiction layer 1902 may be deposited by, for example, CVD, PVD, ALD, sputtering, donor wafer bonding deposition, some other deposition process, or a combination of the foregoing. In further embodiments, the one or more outgassing species 302 are formed in the anti-stiction layer 1902 during (or after) formation of the anti-stiction layer 1902. For example, the one or more outgassing species 302 may be pumped into a processing chamber during deposition of the anti-stiction layer 1902, thereby forming the anti-stiction layer 1902 with the one or more outgassing species 302 in the anti-stiction layer 1902.

Figure 20:
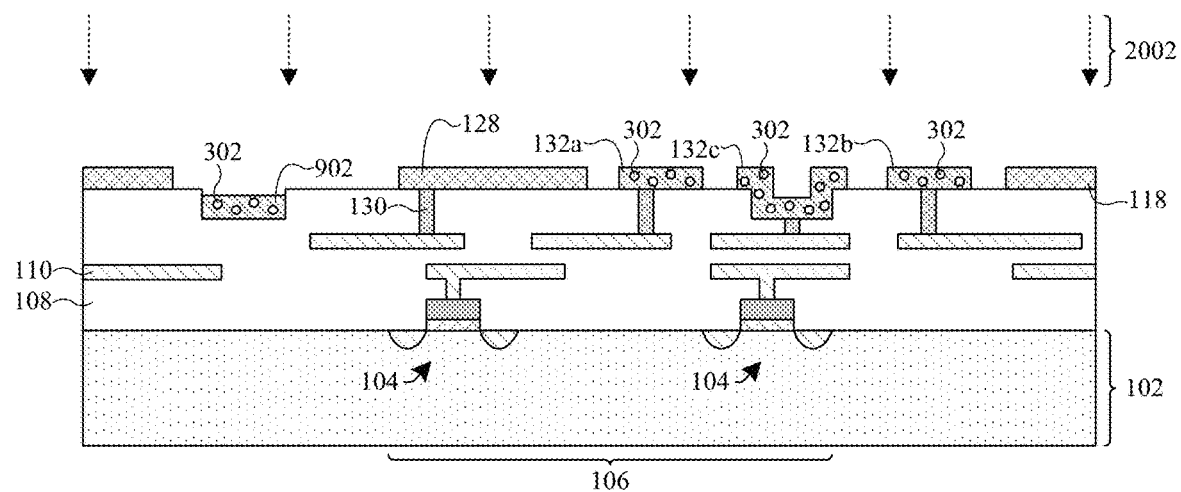

As shown in FIG. 20, a plurality of anti-stiction structures 132*a-c* are formed over/in the ILD structure 108. In some embodiments, a process for forming the plurality of anti-stiction structures 132*a-c* comprises depositing a patterned masking layer (not shown) on the anti-stiction layer 1902 (see, e.g., FIG. 19). Thereafter, an etching process 2002 is performed on the anti-stiction layer 1902 with the patterned masking layer in place. The etching process 2002 comprises exposing the anti-stiction layer 1902 to an etchant to remove unmasked portions of anti-stiction layer 1902, thereby forming the plurality of anti-stiction structures 132*a-c*. Subsequently, in some embodiments, the patterned masking layer is stripped away. In further embodiments, the etching process 2002 may remove an upper portion of the outgassing structure 902, such that the upper surface of the outgassing structure 902 is disposed below the upper surface of the ILD structure 108. It will be appreciated that, in some embodiments, the first sensing electrode 128 and the plurality of anti-stiction structures 132*a-c* may be formed by a same process (e.g., an embodiment in which the first sensing electrode 128 and the plurality of anti-stiction structures 132*a-c* are both a silicon-based semiconductor). In yet further embodiments, the process for forming the plurality of anti-stiction structures 132*a-c* is referred to as a layout patterning formation process.

Figure 21:
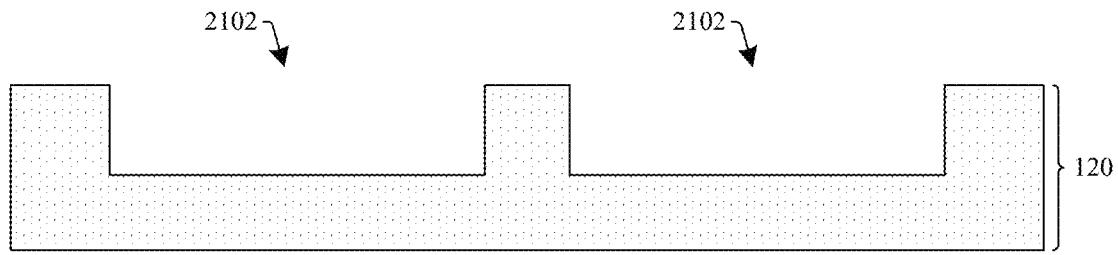

As shown in FIG. 21, a plurality of third openings 2102 are formed in a third semiconductor substrate 120. In some embodiments, a process for forming the plurality of third openings 2102 comprises forming a patterned masking layer (not shown) on the third semiconductor substrate 120. Thereafter, the third semiconductor substrate 120 is exposed to an etchant to remove unmasked portions of the third semiconductor substrate 120, thereby forming the plurality of third openings 2102. Subsequently, in some embodiments, the patterned masking layer is stripped away.

Figure 22:
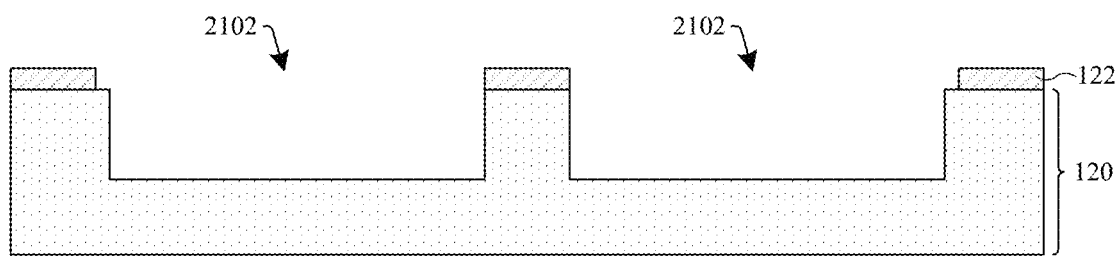

As shown in FIG. 22, a second bond structure 122 is formed on the third semiconductor substrate 120. In some embodiments, a process for forming the second bond structure comprises depositing or growing a first bond layer (not shown) on the third semiconductor substrate 120 and lining the plurality of third openings 2102. A patterned masking layer (not shown) is then formed on the first bond layer. Thereafter, the first bond layer is exposed to an etchant to remove unmasked portions of first bond layer, thereby forming the second bond structure 122. Subsequently, in some embodiments, the patterned masking layer is stripped away. In some embodiments, the first bond layer may be deposited or grown by, for example, CVD, PVD, ALD, thermal oxidation, sputtering, an epitaxy process, electrochemical plating, electroless plating, some other deposition or growth process, or a combination of the foregoing. In further embodiments, the first bond layer may comprise, for example, Ge, $SiO_2$, Cu, Al, Au, Sn, Ti, some other bonding material, or a combination of the foregoing. It will be appreciated that, in some embodiments, the second bond structure 122 may be formed before the plurality of third openings 2102 are formed.

Figure 23:
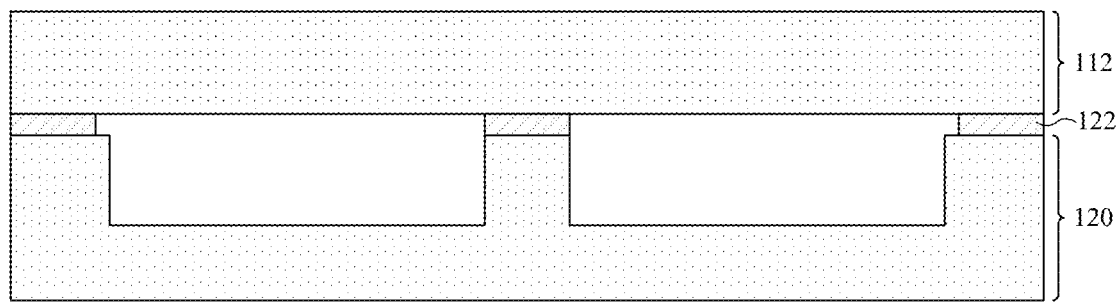

As shown in FIG. 23, a second semiconductor substrate 112 is bonded to the third semiconductor substrate 120. In some embodiments, the second semiconductor substrate 112 is bonded to the third semiconductor substrate 120 via the second bond structure 122. In further embodiments, a process for bonding the second semiconductor substrate 112 to the third semiconductor substrate 120 comprises positioning the second semiconductor substrate 112 so that the second semiconductor substrate 112 is aligned with the third semiconductor substrate 120 and faces the second bond structure 122. Thereafter, the second semiconductor substrate 112 is bonded to the second bond structure 122 (e.g., via a direct bonding process), thereby bonding the second semiconductor substrate 112 to the third semiconductor substrate 120. It will be appreciated that, in some embodiments, the second semiconductor substrate 112 may be bonded to the third semiconductor substrate 120 by a different bonding process (e.g., a hybrid boning process, a eutectic bonding process, etc.).

Figure 24:
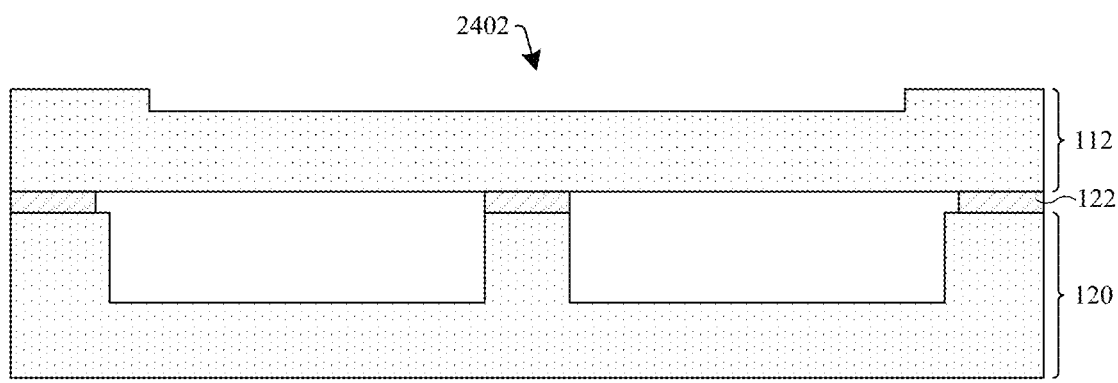

As shown in FIG. 24, a fourth opening 2402 is formed in the second semiconductor substrate 112. The fourth opening 2402 reduces a thickness of a portion of the second semiconductor substrate 112. In some embodiments, a process for forming the fourth opening 2402 comprises forming a patterned masking layer (not shown) on the second semiconductor substrate 112. Thereafter, the second semiconductor substrate 112 is exposed to an etchant to remove unmasked portions of the second semiconductor substrate 112, thereby forming the fourth opening 2402. Subsequently, in some embodiments, the patterned masking layer is stripped away.

Figure 25:
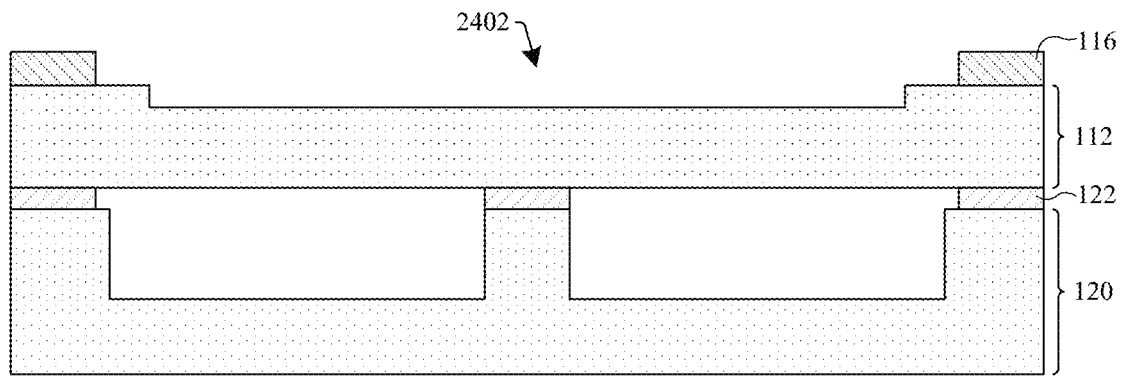

As shown in FIG. 25, an upper bond ring 116 is formed on the second semiconductor substrate 112. In some embodiments, the upper bond ring 116 is formed laterally surrounding the fourth opening 2402. In further embodiments, a process for forming the upper bond ring 116 comprises depositing or growing a second bond layer (not shown) on the second semiconductor substrate 112 and lining the fourth opening 2402. A patterned masking layer (not shown) is then formed on the second bond layer. Thereafter, the second bond layer is exposed to an etchant to remove unmasked portions of second bond layer, thereby forming the upper bond ring 116. Subsequently, in some embodiments, the patterned masking layer is stripped away. In further embodiments, the second bond layer may be deposited or grown by, for example, CVD, PVD, ALD, thermal oxidation, sputtering, an epitaxy process, electrochemical plating, electroless plating, some other deposition or growth process, or a combination of the foregoing. In yet further embodiments, the second bond layer may comprise, for example, Ge, Cu, Al, Au, Sn, some other bonding material, or a combination of the foregoing. It will be appreciated that, in some embodiments, the upper bond ring 116 may be formed before the fourth opening 2402 is formed.

Figure 26:
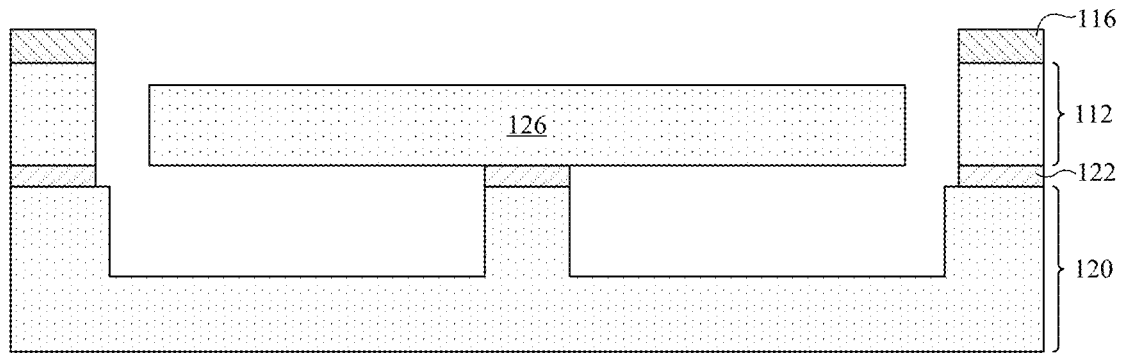

As shown in FIG. 26, a movable mass 126 is formed in the second semiconductor substrate 112. In some embodiments, a process for forming the movable mass 126 comprises forming a patterned masking layer (not shown) on the second semiconductor substrate 112 and the upper bond ring 116, and lining the fourth opening 2402 (see, e.g., FIG. 24). Thereafter, the second semiconductor substrate 112 is exposed to an etchant to remove unmasked portions of the second semiconductor substrate 112, thereby forming the movable mass 126. Subsequently, in some embodiments, the patterned masking layer is stripped away.

Figure 27:
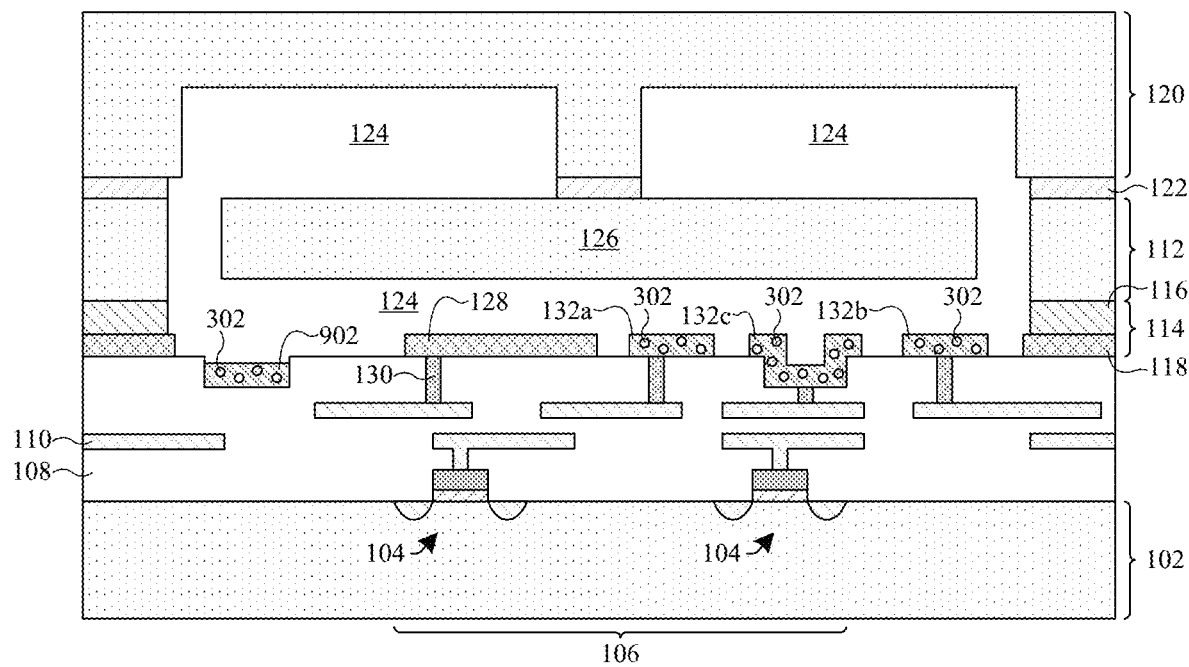

As shown in FIG. 27, both the second semiconductor substrate 112 and the third semiconductor substrate 120 are bonded to the first semiconductor substrate 102. In some embodiments, the second semiconductor substrate 112 and the third semiconductor substrate 120 are bonded to the first semiconductor substrate 102 via the upper bond ring 116 and the lower bond ring 118. In further embodiments, a process for bonding the second semiconductor substrate 112 and the third semiconductor substrate 120 to the first semiconductor substrate 102 comprises positioning the second semiconductor substrate 112 and the third semiconductor substrate 120 so that the upper bond ring 116 is aligned with and facing the lower bond ring 118. Thereafter, the upper bond ring 116 is bonded to the lower bond ring 118 (e.g., via a eutectic bonding process), thereby bonding the second semiconductor substrate 112 and the third semiconductor substrate 120 to the first semiconductor substrate 102. It will be appreciated that, in some embodiments, the second semiconductor substrate 112 and the third semiconductor substrate 120 may be bonded to the first semiconductor substrate 102 by a different bonding process (e.g., a hybrid boning process, a eutectic bonding process, etc.).

In some embodiments, bonding the upper bond ring 116 to the lower bond ring 118, forms a first bond structure 114 that laterally surrounds the movable mass 126. In further embodiments, bonding the second semiconductor substrate 112 and the third semiconductor substrate 120 to the first semiconductor substrate 102, forms a cavity 124 in which the movable mass 126 is disposed. In further embodiments, after the second semiconductor substrate 112 and the third semiconductor substrate 120 are bonded to the first semiconductor substrate 102, the one or more outgassing species 302 are outgassed into the cavity 124 (e.g., by heating the MEMS device 100 to an outgassing temperature). In yet further embodiments, after the second semiconductor substrate 112 and the third semiconductor substrate 120 are bonded to the first semiconductor substrate 102, formation of the MEMS device 100 is complete.

Figure 28:
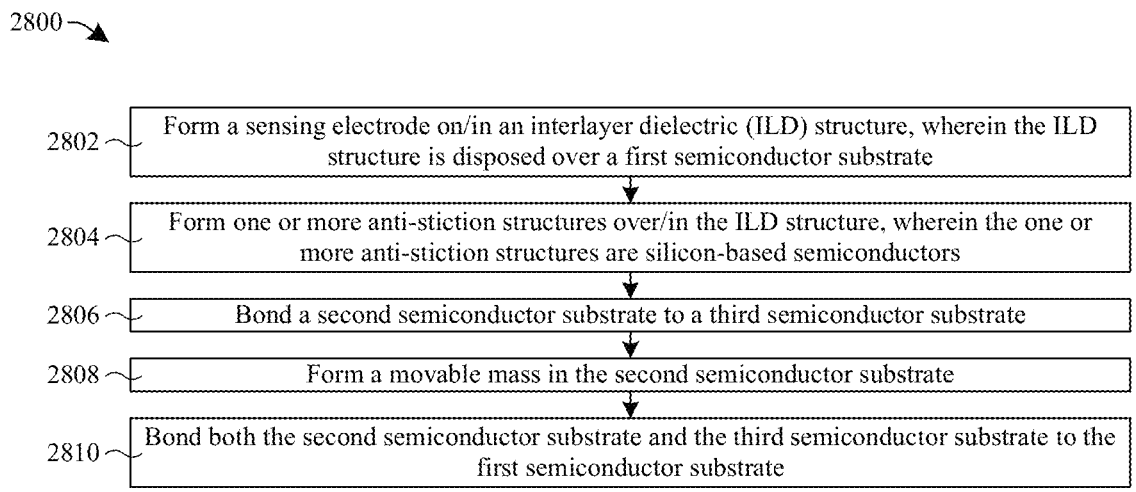
FIG. 28 illustrates a flowchart of some embodiments of a method for forming a microelectromechanical systems (MEMS) device having a mechanically robust anti-stiction structure.

FIG. 28 illustrates a flowchart of some embodiments of a method for forming a microelectromechanical systems (MEMS) device having a mechanically robust anti-stiction structure. While the flowchart 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2802, a sensing electrode is formed on/in an interlayer dielectric (ILD) structure, wherein the ILD structure is disposed over a first semiconductor substrate. FIG. 17 illustrates a cross-sectional view of some embodiments corresponding to act 2802. In some embodiments, an outgassing structure may be formed in the ILD structure before (or after) the sensing electrode is formed. FIGS. 13-16 illustrate a series of cross-sectional views of some embodiments for forming the outgassing structure.

At act 2804, one or more anti-stiction structures are formed over/in the ILD structure, wherein the one or more anti-stiction structures are silicon-based semiconductors. FIGS. 18-20 illustrate a series of cross-sectional views of some embodiments corresponding to act 2804.

At act 2806, a second semiconductor is bonded to a third semiconductor substrate. FIGS. 21-25 illustrate a series of cross-sectional views of some embodiments corresponding to act 2806.

At act 2808, a movable mass is formed in the second semiconductor substrate. FIG. 26 illustrates a cross-sectional view of some embodiments corresponding to act 2808.

At act 2810, both the second semiconductor substrate and the third semiconductor substrate are bonded to the first semiconductor substrate. FIG. 27 illustrates a cross-sectional view of some embodiments corresponding to act 2810.

In some embodiments, the present application provides a microelectromechanical system (MEMS) device. The MEMS device comprises a dielectric structure disposed over a first semiconductor substrate, wherein the dielectric structure at least partially defines a cavity. A second semiconductor substrate is disposed over the dielectric structure. The second semiconductor substrate comprises a movable mass, wherein opposite sidewalls of the movable mass are disposed between opposite sidewall of the cavity. An anti-stiction structure is disposed between the movable mass and the dielectric structure, wherein the anti-stiction structure is a first silicon-based semiconductor.

In some embodiments, the present application provides a microelectromechanical system (MEMS) device. The MEMS device comprises a sensing circuit disposed on a first semiconductor substrate. An interlayer dielectric (ILD) structure is disposed over the first semiconductor substrate and the sensing circuit, wherein the ILD structure at least partially defines a cavity. An interconnect structure is embedded in the ILD structure, wherein the interconnect structure is electrically coupled to the sensing circuit. A second semiconductor substrate is disposed over the ILD structure. The second semiconductor substrate comprises a movable mass, wherein opposite sidewalls of the movable mass are disposed between opposite sidewall of the cavity. An anti-stiction structure is disposed between the movable mass and the ILD structure, wherein the anti-stiction structure is a silicon-based semiconductor and is electrically coupled to the interconnect structure, and wherein the sensing circuit is configured to measure a change in capacitive coupling between the movable mass and the anti-stiction structure.

In some embodiments, the present application provides a method for forming a microelectromechanical system (MEMS) device. The method comprises forming a sensing electrode over an interlayer dielectric (ILD) structure, wherein the ILD structure is disposed over a first semiconductor substrate. An anti-stiction structure is formed over the ILD structure, wherein the anti-stiction structure is a silicon-based semiconductor. A second semiconductor substrate is bonded to a third semiconductor substrate. A movable mass is formed in the second semiconductor substrate. After the second semiconductor substrate and the third semiconductor substrate are bonded together, the second semiconductor substrate and the third semiconductor substrate are bonded to the first semiconductor substrate The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical system (MEMS) device, comprising:
    a dielectric structure disposed over a first semiconductor substrate, wherein the dielectric structure at least partially defines a cavity;
    a second semiconductor substrate disposed over the dielectric structure and comprising a movable mass, wherein opposite sidewalls of the movable mass are disposed between opposite sidewalls of the cavity;
    an anti-stiction structure disposed between the movable mass and the dielectric structure, wherein the anti-stiction structure is a first silicon-based semiconductor; and
    an electrode disposed between the movable mass and the dielectric structure, wherein the electrode is a second silicon-based semiconductor, and wherein both the electrode and the anti-stiction structure are amorphous solids.

2. The MEMS device of claim 1, further comprising:
    an interconnect structure disposed in the dielectric structure, wherein the anti-stiction structure is electrically coupled to the interconnect structure.

3. The MEMS device of claim 1, wherein an electrical resistivity of the anti-stiction structure is between about 0.5 milliohm-centimeter (mΩ·cm) and about 100 ohm-centimeter (Ω·cm).

4. The MEMS device of claim 1, wherein the anti-stiction structure comprises one or more outgassing species.

5. The MEMS device of claim 1,
    wherein an uppermost surface of the anti-stiction structure is disposed below an uppermost surface of the electrode.

6. The MEMS device of claim 1,
    wherein an uppermost surface of the anti-stiction structure is disposed over an uppermost surface of the electrode.

7. The MEMS device of claim 1,
    wherein an uppermost surface of the anti-stiction structure is co-planar with an uppermost surface of the electrode.

8. The MEMS device of claim 1, wherein the anti-stiction structure is partially embedded below an uppermost surface of the dielectric structure and partially disposed over the uppermost surface of the dielectric structure.

9. The MEMS device of claim 8, wherein the anti-stiction structure has a first upper surface disposed below the uppermost surface of the dielectric structure and a second upper surface disposed over the uppermost surface of the dielectric structure.

10. A microelectromechanical system (MEMS) device, comprising:
- a sensing circuit disposed on a first semiconductor substrate;
- an interlayer dielectric (ILD) structure disposed over the first semiconductor substrate and the sensing circuit, wherein the ILD structure at least partially defines a cavity;
- an interconnect structure embedded in the ILD structure, wherein the interconnect structure is electrically coupled to the sensing circuit;
- a second semiconductor substrate disposed over the ILD structure and comprising a movable mass, wherein opposite sidewalls of the movable mass are disposed between opposite sidewalls of the cavity;
- an anti-stiction structure disposed between the movable mass and the ILD structure, wherein the anti-stiction structure is a silicon-based semiconductor and is electrically coupled to the interconnect structure, and wherein the sensing circuit is configured to measure a change in capacitive coupling between the movable mass and the anti-stiction structure, wherein the anti-stiction structure comprises one or more outgassing species; and
- a silicon-based outgassing structure disposed between the movable mass and the ILD structure, wherein the silicon-based outgassing structure is spaced from the anti-stiction structure.

11. The MEMS device of claim 10, wherein the anti-stiction structure has a first upper surface disposed below an uppermost surface of the ILD structure, and a second upper surface disposed over the uppermost surface of the ILD structure.

12. The MEMS device of claim 10, wherein an uppermost surface of the silicon-based outgassing structure is co-planar with an uppermost surface of the ILD structure, and wherein an uppermost surface of the anti-stiction structure is disposed over the uppermost surface of the silicon-based outgassing structure.

13. The MEMS device of claim 10, further comprising:
an electrode disposed between the movable mass and the ILD structure, wherein the electrode is disposed vertically between the anti-stiction structure and the ILD structure, and the electrode contacts both the ILD structure and the anti-stiction structure.

14. The MEMS device of claim 13, wherein the anti-stiction structure has a yield stress greater than a yield stress of the electrode.

15. The MEMS device of claim 14, wherein opposite sidewalls of the anti-stiction structure are substantially aligned with opposite sidewalls of the electrode, respectively.

16. The MEMS device of claim 15, wherein:
the electrode has a first chemical composition; and
the anti-stiction structure has a second chemical composition different than the first chemical composition.

17. The MEMS device of claim 10, wherein the anti-stiction structure is an amorphous solid.

18. A microelectromechanical system (MEMS) device, comprising:
- a sensing circuit disposed on a first semiconductor substrate;
- an interlayer dielectric (ILD) structure disposed over the first semiconductor substrate and the sensing circuit, wherein the ILD structure at least partially defines a cavity;
- an interconnect structure embedded in the ILD structure, wherein the interconnect structure is electrically coupled to the sensing circuit;
- a second semiconductor substrate bonded to the first semiconductor substrate, wherein the second semiconductor substrate is bonded to the first semiconductor substrate via a bonding structure that contacts both the ILD structure and the second semiconductor substrate, wherein the bonding structure at least partially defines the cavity, and wherein the second semiconductor substrate comprises a movable mass disposed between opposite sidewalls of the cavity;
- an electrode disposed between the ILD structure and the movable mass, wherein the electrode is electrically coupled to the interconnect structure and comprises a silicon-based semiconductor;
- a first anti-stiction structure disposed between the ILD structure and the movable mass, wherein the first anti-stiction structure is spaced from the electrode, and wherein the first anti-stiction structure comprises the silicon-based semiconductor and one or more outgassing species, wherein the first anti-stiction structure is partially embedded in the ILD structure and partially disposed over the ILD structure; and
- a second anti-stiction structure disposed between the ILD structure and the movable mass, wherein the second anti-stiction structure is spaced from the electrode, wherein the electrode is disposed laterally between the first anti-stiction structure and the second anti-stiction structure, and wherein the second anti-stiction structure comprises the silicon-based semiconductor and the one or more outgassing species.

19. The MEMS device of claim 18, wherein the first anti-stiction structure has a first upper surface disposed beneath an uppermost surface of the ILD structure and a second upper surface that is disposed over the uppermost surface of the ILD structure.

20. The MEMS device of claim 18, wherein the first anti-stiction structure and the second anti-stiction structure are amorphous solids.

* * * * *